United States Patent
Lee et al.

(10) Patent No.: US 10,446,636 B2
(45) Date of Patent: Oct. 15, 2019

(54) ORGANIC LIGHT EMITTING DIODE DISPLAY DEVICE AND METHOD FOR MANUFACTURING THE SAME

(71) Applicant: SAMSUNG DISPLAY CO., LTD., Yongin-si, Gyeonggi-do (KR)

(72) Inventors: Jeongho Lee, Seoul (KR); Deukjong Kim, Cheonan-si (KR); Yanghee Kim, Seongnam-si (KR); Sangki Kim, Hwaseong-si (KR); Donghyun Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/785,880

(22) Filed: Oct. 17, 2017

(65) Prior Publication Data
US 2018/0108724 A1    Apr. 19, 2018

(30) Foreign Application Priority Data

Oct. 17, 2016 (KR) .......................... 10-2016-0134469

(51) Int. Cl.
| | |
|---|---|
| *H01L 27/32* | (2006.01) |
| *H01L 51/00* | (2006.01) |
| *H01L 27/12* | (2006.01) |
| *H05K 1/02* | (2006.01) |
| *H01L 27/02* | (2006.01) |

(52) U.S. Cl.
CPC ...... *H01L 27/3276* (2013.01); *H01L 27/0277* (2013.01); *H01L 27/1244* (2013.01); *H01L 27/3258* (2013.01); *H01L 27/3262* (2013.01); *H01L 27/3265* (2013.01); *H01L 27/3279* (2013.01); *H01L 51/0097* (2013.01); *H05K 1/0277* (2013.01); *H01L 27/124* (2013.01);
(Continued)

(58) Field of Classification Search
CPC ............ H01L 51/0097; H01L 27/1244; H05K 1/0277
USPC ............................ 257/40; 438/161; 313/498
See application file for complete search history.

(56) References Cited

U.S. PATENT DOCUMENTS

| | | | |
|---|---|---|---|
| 7,825,590 | B2 | 11/2010 | Park et al. |
| 8,629,949 | B2 | 1/2014 | Yun |

(Continued)

FOREIGN PATENT DOCUMENTS

| | | |
|---|---|---|
| KR | 10-2008-0001186 A | 1/2008 |
| KR | 10-2012-0060671 A | 6/2012 |

(Continued)

*Primary Examiner* — David Vu
*Assistant Examiner* — Brandon C Fox
(74) *Attorney, Agent, or Firm* — Innovation Counsel LLP

(57) ABSTRACT

A display device includes: a substrate including a first area, a second area, and a bending portion between the first area and the second area; a pixel at the first area of the substrate; a terminal at the second area of the substrate; a first conductive line on the bending portion of the substrate and extending from the first area to the second area; a first organic layer on the first conductive line; a second inorganic layer on the first organic layer in an area other than the bending portion; and a second conductive line on the first organic layer and the second inorganic layer and overlapping the first conductive line to extend from the first area to the second area. The first conductive line and the second conductive line contact each other in at least one of the first area and the second area.

28 Claims, 16 Drawing Sheets

(52) U.S. Cl.
 CPC .... *H01L 27/1255* (2013.01); *H01L 2227/323* (2013.01); *H01L 2251/5338* (2013.01)

(56) References Cited

U.S. PATENT DOCUMENTS

| | | | |
|---|---|---|---|
| 2014/0353670 A1* | 12/2014 | Youn | H01L 27/124 257/72 |
| 2017/0170206 A1* | 6/2017 | Lee | H01L 27/1218 |
| 2017/0262109 A1* | 9/2017 | Choi | G06F 3/0412 |
| 2017/0288007 A1* | 10/2017 | Shin | H01L 51/56 |
| 2018/0083072 A1* | 3/2018 | Kwon | H01L 27/3211 |
| 2018/0090698 A1* | 3/2018 | Jeong | H01L 27/3276 |

FOREIGN PATENT DOCUMENTS

| | | |
|---|---|---|
| KR | 10-2015-0006706 A | 1/2015 |
| KR | 10-2016-0061170 A | 5/2016 |

\* cited by examiner

ORGANIC LIGHT EMITTING DIODE DISPLAY DEVICE AND METHOD FOR MANUFACTURING THE SAME

CROSS-REFERENCE TO RELATED APPLICATION

This application claims priority under 35 U.S.C. § 119 to Korean Patent Application No. 10-2016-0134469, filed on Oct. 17, 2016, in the Korean Intellectual Property Office (KIPO), the disclosure of which is incorporated by reference herein in its entirety.

1. Technical Field

Exemplary embodiments of the present inventive concept relate to an organic light emitting diode ("OLED") display device having a relatively high luminance and a method of manufacturing the OLED display device.

2. Discussion of Related Art

An OLED display device is a self-emission type display device which displays an image using an OLED that emits light. The OLED display devices are currently garnering attention by virtue of their characteristics such as low power consumption, high luminance, and high response speed.

Recently, there is an increasing demand for an OLED display device having a large area and a high resolution and also having excellent display quality. Accordingly, studies on OLED display devices having high luminance while having a large area and high resolution are proceeding. In addition, researches are being conducted to reduce the area of a bezel so that an image may be displayed on a large screen of display devices.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the present inventive concept may be directed to an organic light emitting diode ("OLED") display device having high resolution and high luminance, and to a method of manufacturing the OLED display device.

Further, exemplary embodiments of the present inventive concept may be directed to an OLED display device including a narrow bezel and to a method of manufacturing the OLED display device.

According to an exemplary embodiment, a display device includes: a substrate including a first area, a second area, and a bending portion disposed between the first area and the second area; a pixel disposed on the first area of the substrate; a terminal disposed on the second area of the substrate; a first conductive line disposed on the bending portion of the substrate and extending from the first area to the second area; a first organic layer disposed on the first conductive line; a first inorganic layer disposed on the first organic layer in an area other than the bending portion; and a second conductive line disposed on the first organic layer and the first inorganic layer and overlapping the first conductive line to extend from the first area to the second area.

The first conductive line and the second conductive line contact each other in at least one of the first area and the second area.

The display device may further include a second inorganic layer disposed between the first conductive line and the first organic layer.

The first conductive line and the second conductive line may constitute one link line.

The first conductive line and the second conductive line may be connected to the pixel.

The pixel may include a common power line, and the first conductive line and the second conductive line may be connected to the common power line.

The common power line may include a first power line and a second power line, the first power line may be disposed on a substantially same plane as the first conductive line, and the second power line may be disposed on a substantially same plane as the second conductive line.

The first power line and the first conductive line may include a substantially same material.

The first power line and the first conductive line may be integrally formed.

The second power line and the second conductive line may include a substantially same material.

The second power line and the second conductive line may be integrally formed.

The pixel may include the second inorganic layer, the first organic layer and the first inorganic layer sequentially disposed between the first power line and the second power line.

The first power line and the second power line may contact each other in the pixel.

The pixel may include an organic light emitting element, and the common power line may be connected to the organic light emitting element through at least one thin film transistor.

The pixel may be connected to a data line at the first area, and the first conductive line and the second conductive line may be connected to the data line.

The data line may include a lower line and an upper line overlapping the lower line, the lower line may be disposed on a substantially same plane as the first conductive line, and the upper line may be disposed on a substantially same plane as the second conductive line.

The lower line and the first conductive line may include a substantially same material.

The lower line and the first conductive line may be integrally formed.

The upper line and the second conductive line may include a substantially same material.

The upper line and the second conductive line may be integrally formed.

The pixel may include the second inorganic layer, the first organic layer and the first inorganic layer sequentially disposed between the lower line and the upper line.

The lower line and the upper line may contact each other in the pixel.

The substrate may be bent at the bending portion, and an inner radius of curvature of the bending portion may be in a range of about 0 μm to about 500 μm.

According to another exemplary embodiment, a method of manufacturing a display device includes: forming a first conductive line on a substrate including a bending portion, the first conductive line passing through the bending portion; forming a first organic layer on the first conductive line; forming a first inorganic layer on the first organic layer; removing the first inorganic layer in a selective manner to expose the first organic layer in a selective manner; and forming a second conductive line on the first inorganic layer and the selectively exposed first organic layer. Removing the second conductive line in a selective manner includes removing the first inorganic layer disposed on the bending portion.

The method may further include forming a second inorganic layer on the first conductive line after forming the first conductive line and before forming the first organic layer.

The first organic layer may have a contact hole, and removing the first inorganic layer in a selective manner may include removing the second inorganic layer and the first inorganic layer at the contact hole.

The first conductive line and the second conductive line may contact each other at the contact hole.

According to another exemplary embodiment, a display device includes: a substrate including a bending portion; a gate line extending along a first direction on the substrate; a data line extending along a second direction on the substrate, the data line intersecting the gate line; and a common power line extending along the second direction on the substrate, the common power line spaced apart from the data line and intersecting the gate line; a first link line connected to the common power line, extending from the common power line and passing through the bending portion; and a second link line connected to the data line, extending from the data line and passing through the bending portion. At least one of the first link line and the second link line includes a first conductive line and a second conductive line overlapping each other with an insulating layer interposed therebetween. The insulating layer includes: a first organic layer disposed on the first conductive line; and a first inorganic layer disposed on the first organic layer in a selective manner. The first inorganic layer is disposed on an area other than the bending portion.

The insulating layer further may include a second inorganic layer disposed between the first conductive line and the first organic layer.

The foregoing is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the present inventive concept will become more apparent by describing in detail exemplary embodiments thereof with reference to the accompanying drawings, wherein.

DETAILED DESCRIPTION

Figure 1:
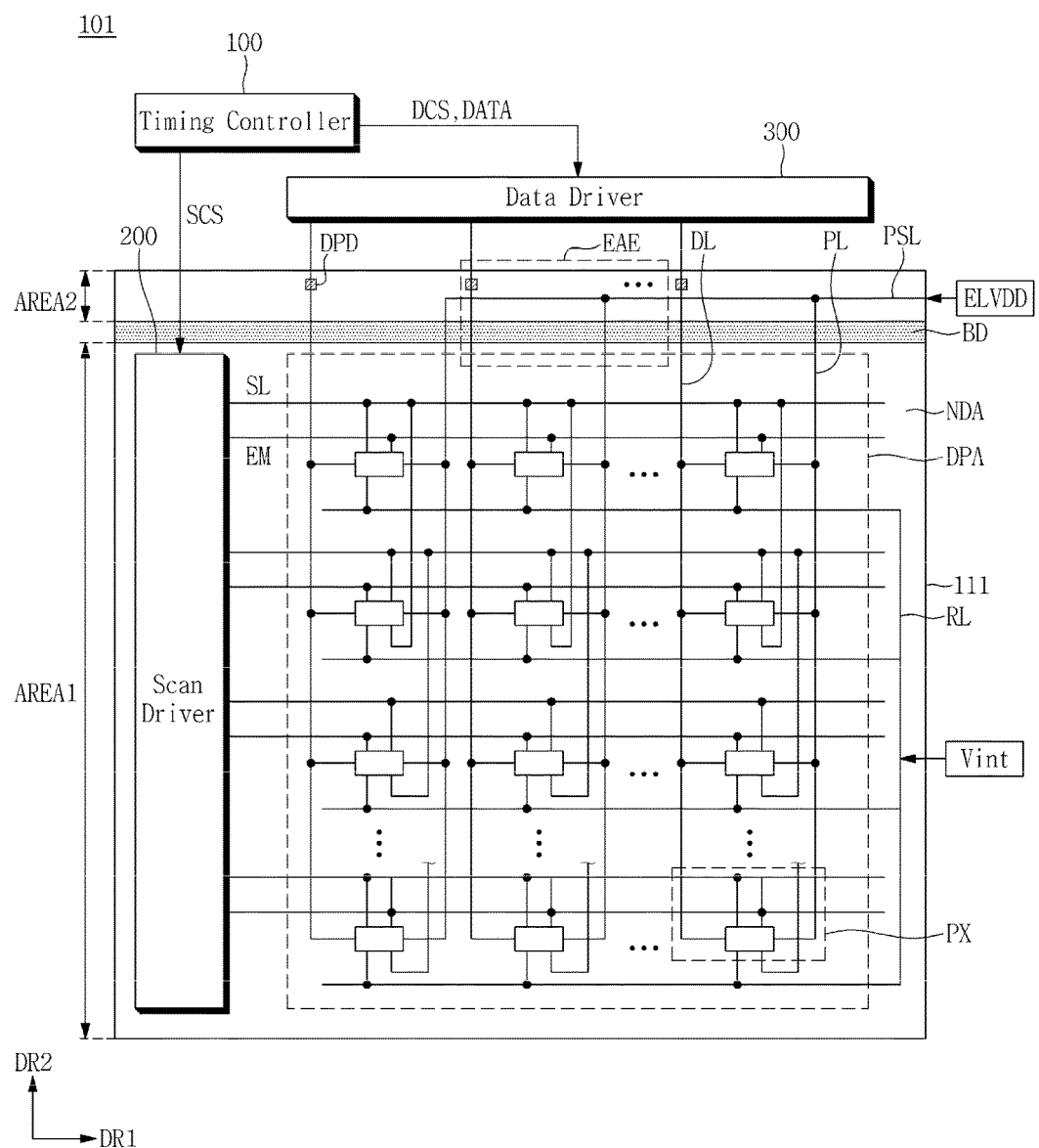
FIG. 1 is a block diagram illustrating an organic light emitting diode ("OLED") display device according to an exemplary embodiment.

Exemplary embodiments will now be described more fully hereinafter with reference to the accompanying drawings. Although the inventive concept may be modified in various manners and have several exemplary embodiments, exemplary embodiments are illustrated in the accompanying drawings and will be mainly described in the specification. However, the scope of the inventive concept is not limited to the exemplary embodiments and should be construed as including all the changes, equivalents, and substitutions included in the spirit and scope of the inventive concept.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments of the present inventive concept, and like reference numerals refer to like elements throughout the specification.

Hereinafter, a display device according to an exemplary embodiment will be described with reference to FIGS. 1, 2, 3, 4, 5 and 6. The display device according to an exemplary embodiment is an organic light emitting diode ("OLED") display device 101.

For example, FIG. 1 is a block diagram illustrating the OLED display device 101 according to an exemplary embodiment. As illustrated in FIG. 1, the OLED display device 101 includes a timing controller 100, a scan driver 200, a data driver 300 and a display area DPA.

The timing controller 100 receives input image signals (not illustrated) and generates image data. In addition, the timing controller 100 outputs image data and various control signals DCS and SCS.

The scan driver 200 receives a scan control signal SCS from the timing controller 100. The scan control signal SCS may include a vertical start signal for starting the operation of the scan driver 200, a clock signal for determining an output timing of signals, and the like. The scan driver 200 generates a plurality of scan signals and sequentially outputs the plurality of scan signals to a plurality of gate lines SL to be described below. In addition, the scan driver 200 generates a plurality of light emission control signals in response to the scan control signal SCS and outputs a plurality of light emission control signals to a plurality of light emission control lines EM to be described below.

It is illustrated in FIG. 1 that the plurality of scan signals and the plurality of light emission control signals are output from a single scan driver 200, but exemplary embodiments are not limited thereto. In an exemplary embodiment, the plurality of scan drivers divide and output the plurality of scan signals, and divide and output the plurality of light emission control signals. In addition, in an exemplary embodiment, a driving circuit generating and outputting the plurality of scan signals and a driving circuit generating and outputting the plurality of light emission control signals may be separately provided.

The data driver 300 receives a data control signal DCS and the image data DATA from the timing controller 100. The data driver 300 converts the image data DATA into data signals and outputs the data signals to a plurality of data lines DL to be described below. The data signal is an analog voltage corresponding to a gray level value of the image data DATA.

The display area DPA includes the plurality of gate lines SL, the plurality of light emission control lines EM, the plurality of data lines DL and a plurality of pixels PX arranged on a substrate 111. The plurality of gate lines SL extend in a first direction DR1 and are arranged in a second direction DR2 intersecting the first direction DR1. Each of the plurality of light emission control lines EM may be arranged in parallel to each corresponding one of the plurality of gate lines SL. The plurality of data lines DL are insulated from and intersect the plurality of gate lines SL.

The pixel PX is connected to the gate line SL, the light emission control line EM and the data line DL. The pixel PX receives a first voltage ELVDD and a second voltage ELVSS having a voltage level lower than that of the first voltage ELVDD (see FIG. 3). The pixel PX includes a common power line PL for applying the first voltage ELVDD and an initialization line RL for receiving an initialization voltage Vint. The first voltage ELVDD is also referred to as a common voltage.

Each pixel PX may be electrically connected to two gate lines. As illustrated in FIG. 1, pixels PX connected to a second gate line (hereinafter, pixels in a second pixel row) may be connected to a first gate line. The pixels PX in the second pixel row receive a scan signal applied to the second gate line and a scan signal applied to the first gate line.

The pixel PX includes an OLED and a circuit controlling light emission of the OLED. The circuit may include a plurality of thin film transistors ("TFTs") and a capacitor. The display area DPA may include a red pixel emitting red light, a green pixel emitting green light, and a blue pixel emitting blue light. The OLED of the red pixel, the OLED of the green pixel and the OLED of the blue pixel may respectively include organic light emitting layers OL each including different materials.

The plurality of gate lines SL, the plurality of light emission control lines EM, the plurality of data lines DL, the common power line PL, the initialization line RL and the plurality of pixels PX may be formed on the substrate 111 through a plurality of patterning processes. In addition, a plurality of insulating layers may be formed on the substrate 111 through a plurality of deposition processes or coating processes. Each of the insulating layers may include at least one of an organic layer and an inorganic layer.

Figure 2:
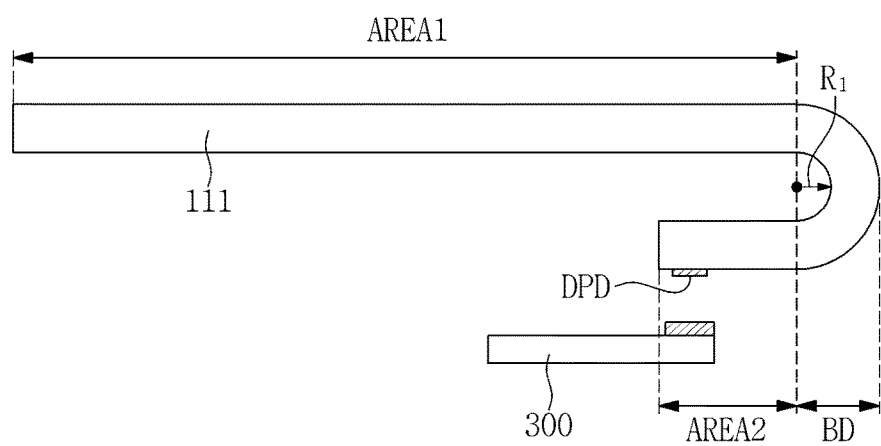
FIG. 2 is a cross-sectional view illustrating a substrate in a bent state.

FIG. 2 is a cross-sectional view illustrating the substrate 111 in a bent state.

The substrate 111 includes a first area AREA1, a second area AREA2 and a bending portion BD between the first area AREA1 and the second area AREA2. Referring to FIGS. 1 and 2, the first area AREA1 and the second area AREA2 may be separated from each other by the bending portion BD.

The display area DPA is disposed in the first area AREA1 of the substrate 111. The display area DPA includes the plurality of pixels PX and displays an image. The second area AREA2 and the bending portion BD are disposed in a non-display area NDA in which no image is displayed.

The substrate 111 has flexible characteristics and is capable of being bent by about 180 degrees as illustrated in FIG. 2. The substrate 111 may be a plastic film, for example.

The second area AREA2 includes a terminal DPD, and through the terminal DPD, various driving means may be connected to various signal lines on the substrate 111. For example, the data driver 300 may be connected to a terminal DPD at the second area AREA2.

Referring to FIG. 2, the substrate 111 is bent at the bending portion BD so that the second area AREA2 may overlap the first area AREA1. That is, the second area AREA2 including the terminal DPD may be disposed on a rear surface of the display area DPA. As such, the OLED display device 101 may realize a narrow bezel.

According to an exemplary embodiment, in the bent state, an inner radius of curvature R1 of the bending portion BD may be about 1,000 μm or less. For example, in the bent state, the inner radius of curvature R1 of the bending portion BD may be in a range of about 0 μm to about 500 μm. When the substrate 111 includes a thin film having excellent flexible characteristics, the inner radius of curvature R1 of the bending portion BD may be in a range of about 0 μm to about 50 μm in the bent state. When the substrate 111 includes a transparent polymer film, the inner radius of curvature R1 of the bending portion BD may be in a range of about 0.1 μm to about 50 μm in the bent state.

Figure 3:
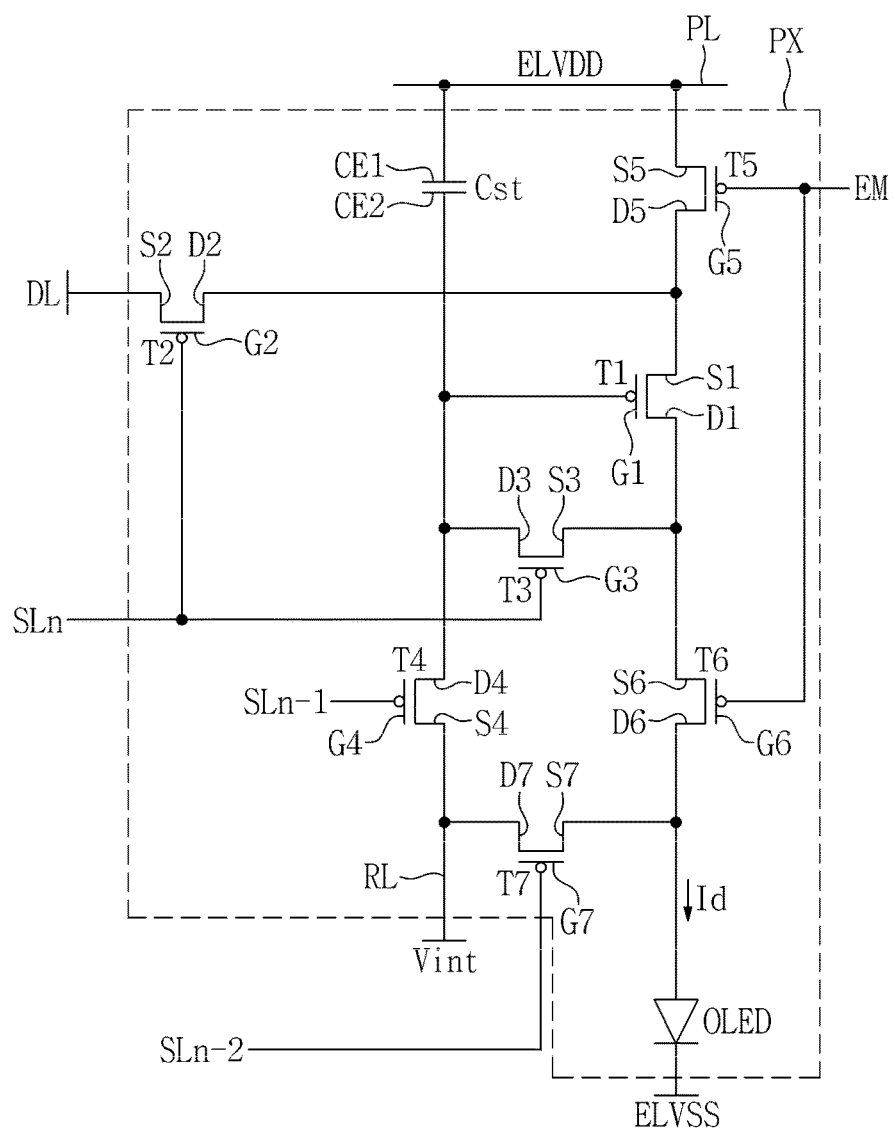
FIG. 3 is a circuit diagram illustrating a pixel of an OLED display device according to an exemplary embodiment.

FIG. 3 is a circuit diagram illustrating one pixel PX of the OLED display device 101 according to an exemplary embodiment.

As illustrated in FIG. 3, each pixel PX of the OLED display device 101 according to an exemplary embodiment includes a plurality of TFTs T1, T2, T3, T4, T5, T6 and T7, a plurality of wirings SLn, Sn-1, Sn-2, EM, Vint, DL and PL selectively connected to the plurality of TFTs T1, T2, T3, T4, T5, T6 and T7, and an OLED.

The plurality of TFTs T1, T2, T3, T4, T5, T6 and T7 include a first TFT T1, a second TFT T2, a third TFT T3, a fourth TFT T4, a fifth TFT T5, a sixth TFT T6 and a seventh TFT T7.

A first gate electrode G1 of the first TFT T1 is connected to a third drain electrode D3 of the third TFT T3 and a fourth drain electrode D4 of the fourth TFT T4, a first source electrode S1 of the first TFT T1 is connected to a second drain electrode D2 of the second TFT T2 and a fifth drain electrode D5 of the fifth TFT T5, and a first drain electrode D1 of the first TFT T1 is connected to a third source electrode S3 of the third TFT T3 and a sixth source electrode S6 of the sixth TFT T6.

A second gate electrode G2 of the second TFT T2 is connected to a first gate line SLn, a second source electrode S2 of the second TFT T2 is connected to the data line DL, and the second drain electrode D2 of the second TFT T2 is connected to the first source electrode S1 of the first TFT T1.

A third gate electrode G3 of the third TFT T3 is connected to the first gate line SLn, the third source electrode S3 of the third TFT T3 is connected to the first drain electrode D1 of the first TFT T1, and the third drain electrode D3 of the third TFT T3 is connected to the first gate electrode G1 of the first TFT T1.

A fourth gate electrode G4 of the fourth TFT T4 is connected to a second gate line SLn-1, a fourth source electrode S4 of the fourth TFT T4 is connected to the initialization line RL, and the fourth drain electrode D4 of the fourth TFT T4 is connected to the first gate electrode G1 of the first TFT T1. The initialization voltage Vint is applied through the initialization line RL.

A fifth gate electrode G5 of the fifth TFT T5 is connected to the light emission control line EM, a fifth source electrode S5 of the fifth TFT T5 is connected to the common power line PL, and the fifth drain electrode D5 of the fifth TFT T5 is connected to the first source electrode S1 of the first TFT T1.

A sixth gate electrode G6 of the sixth TFT T6 is connected to the light emission control line EM, the sixth source electrode S6 of the sixth TFT T6 is connected to the first drain electrode D1 of the first TFT T1, and the sixth drain electrode D6 of the sixth TFT T6 is connected to a first electrode PE1 of the OLED. The first electrode PE1 is a pixel electrode.

A seventh gate electrode G7 of the seventh TFT T7 is connected to a third gate line SLn-2, a seventh source electrode S7 of the seventh TFT T7 is connected to the OLED, and the seventh drain electrode D7 of the seventh TFT T7 is connected to the fourth source electrode S4 of the fourth TFT T4.

As such, signal lines transmitting the scan signal include the first gate line SLn for transmitting a first scan signal to each of the second gate electrode G2 of the second TFT T2 and the third gate electrodes G3 of the third TFT T3, the second gate line SLn-1 for transferring a second scan signal to the fourth gate electrode G4 of the fourth TFT T4, the third gate line SLn-2 for transmitting a third scan signal to the seventh gate electrode G7 of the seventh TFT T7, and the light emission control line EM for transmitting a light emission control signal to the fifth gate electrode G5 of the fifth TFT T5 and the sixth gate electrode G6 of the sixth TFT T6.

A capacitor Cst includes a first electrode CE1 connected to the common power line PL and a second electrode CE2 connected to the first gate electrode G1 of the first TFT T1 and the third drain electrode D3 of the third TFT T3.

Figure 5:
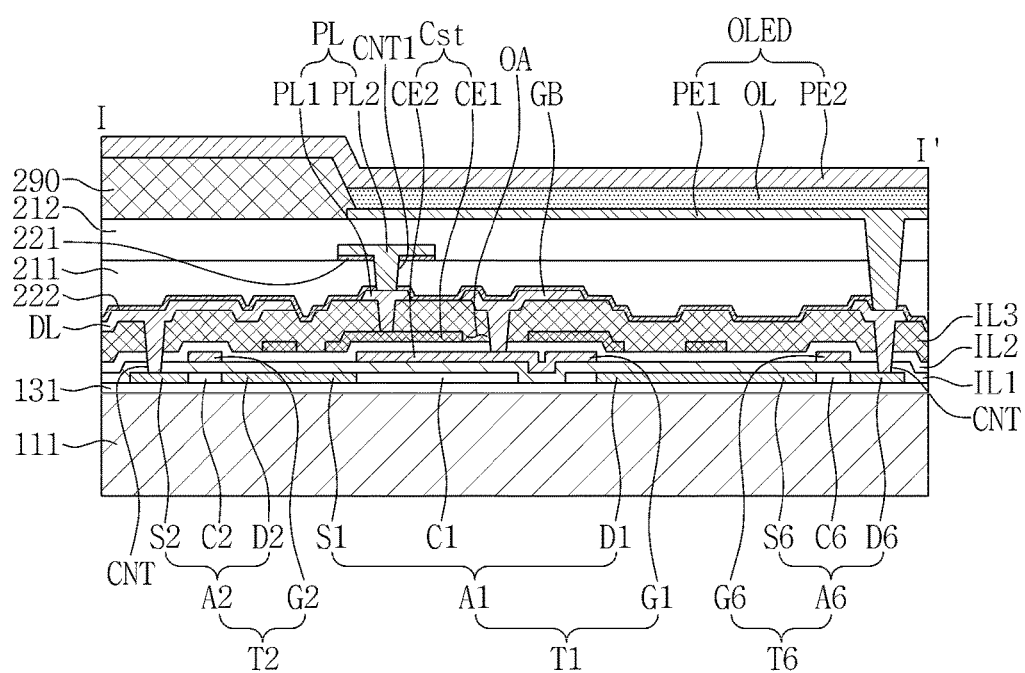
FIG. 5 is a cross-sectional view taken along line I-I' of FIG. 4.

The OLED includes the first electrode PE1, the second electrode PE2 on the first electrode PE1, and an organic light emitting layer OL disposed between the first electrode PE1 and the second electrode PE2 (see FIG. 5). The first electrode PE1 of the OLED is connected to the seventh source electrode S7 of the seventh TFT T7 and the sixth drain electrode D6 of the sixth TFT T6. The second voltage ELVSS is applied through the second electrode PE2.

Hereinafter, the operation of the pixel PX will be described by way of example.

Firstly, when the third scan signal is transmitted to the third gate line SLn-2 to turn on the seventh TFT T7, a residual current flowing through the first electrode PE1 of the OLED is discharged to the fourth TFT T4 through the seventh TFT T7, such that unintended light emission of the OLED due to the residual current flowing through the first electrode PE1 of the OLED may be substantially suppressed.

Next, when the second scan signal is transmitted to the second gate line SLn-1 and the initialization signal is transmitted to the initialization line RL, the fourth TFT T4 is turned on and the initialization voltage Vint is applied through the fourth TFT T4 to the first gate electrode G1 of the first TFT T1 and the second electrode CE2 of the capacitor Cst. Accordingly, the first gate electrode G1 and the capacitor Cst are initialized. In such an exemplary embodiment, as the first gate electrode G1 is initialized, the first TFT T1 is turned on.

Next, when the first scan signal is transmitted to the first gate line SLn and the data signal is transmitted to the data line DL, each of the second TFT T2 and the third TFT T3 is turned on and a data voltage Vd corresponding to the data signal is applied to the first gate electrode G1 through the second TFT T2, the first TFT T1 and the third TFT T3.

In such an exemplary embodiment, a voltage applied to the first gate electrode G1 has a compensated voltage {Vd+Vth, Vth having a negative (−) value} which has a voltage level less than that of the initial data voltage Vd applied from the data line DL by a threshold voltage Vth of the first TFT T1. The compensation voltage (Vd+Vth) applied to the first gate electrode G1 is also applied to the second electrode CE2 of the capacitor Cst connected to the first gate electrode G1.

Next, a driving voltage Vel based on the driving signal is applied from the common power line PL to the first electrode CE1 of the capacitor Cst, and the compensation voltage (Vd+Vth) is applied to the second electrode CE2, such that electric charges corresponding to a difference of voltages respectively applied to the opposing electrodes of the capacitor Cst are stored in the capacitor Cst and thus the first TFT T1 is turned on for a predetermined time.

Next, when the light emission control signal is applied to the light emission control line EM, each of the fifth TFT T5 and the sixth TFT T6 is turned on and the driving voltage Vel based on the driving signal applied from the common power line PL is applied to the first TFT T1 through the fifth TFT T5.

In such an exemplary embodiment, a driving current Id corresponding to a voltage difference between a voltage applied to the first gate electrode G1 by the capacitor Cst and the driving voltage Vel flows through the first drain electrode D1 of the first TFT T1 because the first TFT T1 is turned on by the capacitor Cst, and the driving current Id is applied to the OLED through the sixth TFT T6 such that the OLED emits light for a predetermined time.

The structure of the pixel PX of the OLED display device 101 according to an exemplary embodiment is not limited to the above description, and the pixel PX of the OLED display device 101 may include wirings including a plurality of TFTs, one or more capacitors, one or more gate lines, and one or more driving power lines.

Figure 4:
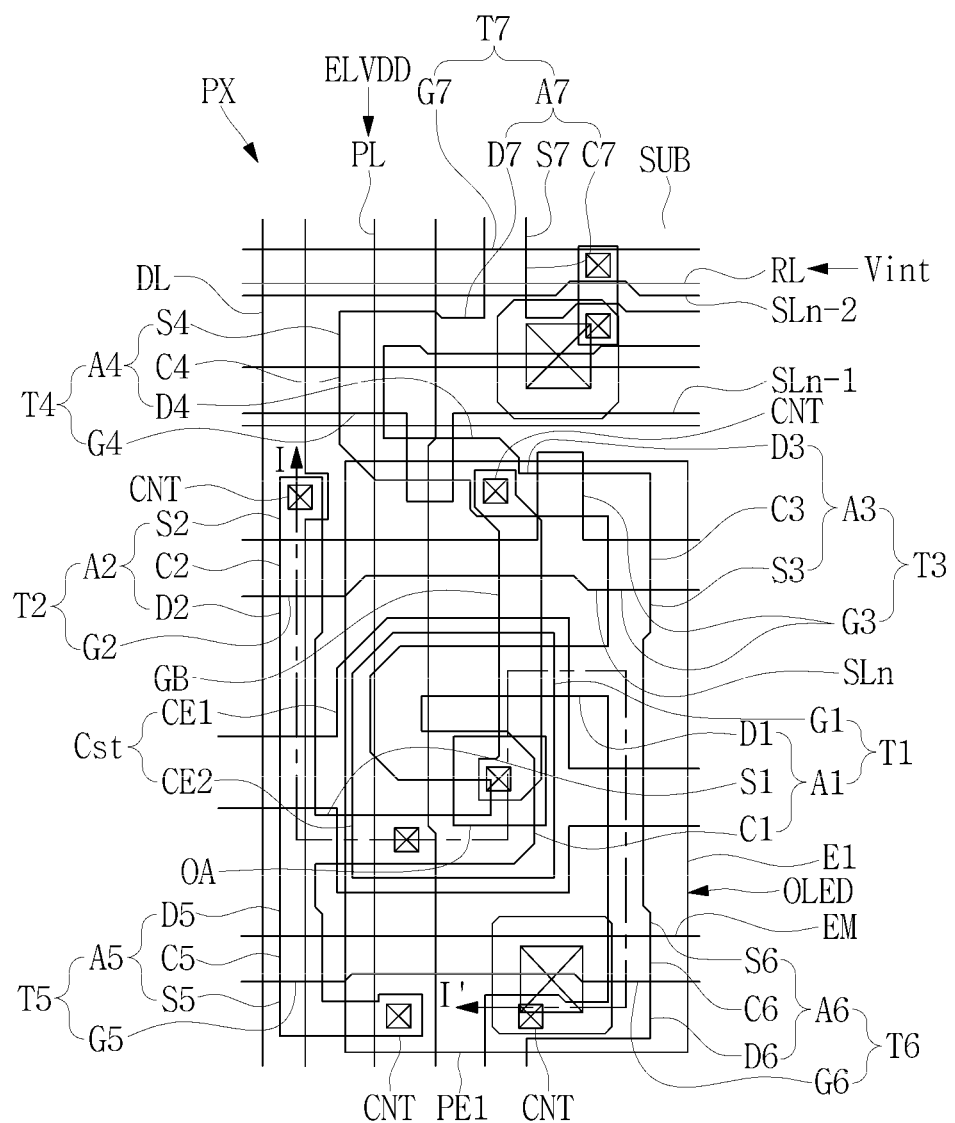
FIG. 4 is a plan view illustrating a pixel of an OLED display device according to an exemplary embodiment.

FIG. 4 is a plan view illustrating a pixel of an OLED display device according to an exemplary embodiment, and FIG. 5 is a cross-sectional view taken along line I-I' of FIG. 4.

As illustrated in FIGS. 4 and 5, the pixel PX on the substrate 111 includes the first TFT T1, the second TFT T2, the third TFT T3, the fourth TFT T4, the fifth TFT T5, the sixth TFT T6, the seventh TFT T7, the first gate line SLn, the second gate line SLn-1, the third gate line SLn-2, the light emission control line EM, the capacitor Cst, the data line DL, the common power line PL, a gate bridge GB, the initialization line RL and the OLED.

The first TFT T1 is located on the substrate 111 and includes a first active layer A1 and the first gate electrode G1.

The first active layer A1 includes the first source electrode S1, a first channel C1, and the first drain electrode D1. The first source electrode S1 is connected to each of the second drain electrode D2 of the second TFT T2 and the fifth drain electrode D5 of the fifth TFT T5, and the first drain electrode D1 is connected to each of the third source electrode S3 of the third TFT T3 and the sixth source electrode S6 of the sixth TFT T6. The first channel (C1), which is a channel area of the first active layer A1 overlapping the first gate electrode G1, is bent at least once to extend therefrom. The first active layer A1 may include polysilicon or an oxide semiconductor. The oxide semiconductor may include at least one selected from the group consisting of: an oxide based on titanium (Ti), hafnium (Hf), zirconium (Zr), aluminum (Al), tantalum (Ta), germanium (Ge), zinc (Zn), gallium (Ga), tin or indium (In), and a compound oxide thereof, such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O) and hafnium-indium-zinc oxide (Hf—In—Zn—O). In the case where the first active layer A1 includes an oxide semiconductor, a protective layer may be additionally provided to protect an oxide semiconductor from external environment such as high temperature.

The first channel C1 of the first active layer A1 may be channel-doped with N-type impurities or P-type impurities, and the first source electrode S1 and the first drain electrode D1 are spaced apart from each other, having the first channel C1 therebetween, to be doped with doping impurities having an opposite type compared to that of the doping impurities doped to the first channel C1.

The first gate electrode G1 is disposed above the first channel C1 of the first active layer A1 and may have an island shape. The first gate electrode G1 is connected to the fourth drain electrode D4 of the fourth TFT T4 and the third drain electrode D3 of the third TFT T3 by the gate bridge GB through a contact hole CNT. The first gate electrode G1 overlapping the first electrode CE1 of the capacitor Cst functions as the gate electrode of the first TFT T1 and also functions as the second electrode CE2 of the capacitor Cst. That is, the first gate electrode G1 forms the capacitor Cst together with the first electrode CE1.

The second TFT T2 is located on the substrate 111 and includes the second active layer A2 and the second gate electrode G2.

The second active layer A2 includes the second source electrode S2, a second channel C2, and the second drain electrode D2. The second source electrode S2 is connected to the data line DL through a contact hole CNT and the second drain electrode D2 is connected to the first source electrode S1 of the first TFT T1. The second channel C2, which is a channel area of the second active layer A2 overlapping the second gate electrode G2, is disposed between the second source electrode S2 and the second drain electrode D2. That is, the second active layer A2 is connected to the first active layer A1.

The second channel C2 of the second active layer A2 may be channel-doped with N-type impurities or P-type impurities, and the second source electrode S2 and the second drain electrode D2 are spaced apart from each other, having the second channel C2 therebetween, to be doped with doping impurities having an opposite type compared to that of the doping impurities doped to the second channel C2. The second active layer A2 is located on a substantially same plane as the first active layer A1, includes a substantially same material as a material included in the first active layer A1, and is formed integrally with the first active layer A1.

The second gate electrode G2 is disposed above the second channel C2 of the second active layer A2 and is formed integrally with the first gate line SLn.

The third TFT T3 is disposed on the substrate 111 and includes a third active layer A3 and the third gate electrode G3.

The third active layer A3 includes the third source electrode S3, a third channel C3, and the third drain electrode D3. The third source electrode S3 is connected to the first drain electrode D1, and the third drain electrode D3 is connected to the first gate electrode G1 of the first TFT T1 by the gate bridge GB through a contact hole CNT. The third channel C3, which is a channel area of the third active layer A3 overlapping the third gate electrode G3, is disposed between the third source electrode S3 and the third drain electrode D3.

The third active layer A3 connects the first active layer A1 and the first gate electrode G1.

The third channel C3 of the third active layer A3 may be channel-doped with N-type impurities or P-type impurities, and the third source electrode S3 and the third drain electrode D3 are spaced apart from each other, having the third channel C3 therebetween, to be doped with doping impurities having an opposite type compared to that of the doping impurities doped to the third channel C3. The third active layer A3 is located on a substantially same plane as the first active layer A1 and the second active layer A2, includes a substantially same material as a material included in the first active layer A1 and the second active layer A2, and is formed integrally with the first active layer A1 and the second active layer A2.

The third gate electrode G3 is disposed above the third channel C3 of the third active layer A3 and is formed integrally with the first gate line SLn. The third gate electrode G3 is formed as a dual gate electrode.

The fourth TFT T4 is disposed on the substrate 111 and includes a fourth active layer A4 and a fourth gate electrode G4.

The fourth active layer A4 includes the fourth source electrode S4, a fourth channel C4, and the fourth drain electrode D4. The fourth source electrode S4 is connected to the initialization line RL through a contact hole, and the fourth drain electrode D4 is connected to the first gate electrode G1 of the first TFT T1 by the gate bridge GB through a contact hole. The fourth channel C4, which is a channel area of the fourth active layer A4 overlapping the fourth gate electrode G4, is disposed between the fourth source electrode S4 and the fourth drain electrode D4. That is, the fourth active layer A4 connects the initialization line RL and the first gate electrode G1, and is connected to each of the third active layer A3 and the first gate electrode G1.

The fourth channel C4 of the fourth active layer A4 may be channel-doped with N-type impurities or P-type impurities, and the fourth source electrode S4 and the fourth drain electrode D4 are spaced apart from each other, having the fourth channel C4 therebetween, to be doped with doping impurities having an opposite type compared to that of the doping impurities doped to the fourth channel C4. The fourth active layer A4 is disposed on a substantially same plane as the first active layer A1, the second active layer A2 and the third active layer A3, includes a substantially same material as a material included in the first active layer A1, the second active layer A2 and the third active layer A3, and is formed integrally with the first active layer A1, the second active layer A2 and the third active layer A3.

The fourth gate electrode G4 is disposed above the fourth channel C4 of the fourth active layer A4 and is formed integrally with the second gate line SLn-1. The fourth gate electrode G4 is formed as a dual gate electrode.

The fifth TFT T5 is disposed on the substrate 111 and includes a fifth active layer A5 and the fifth gate electrode G5.

The fifth active layer A5 includes the fifth source electrode S5, a fifth channel C5, and the fifth drain electrode D5. The fifth source electrode S5 is connected to the common power line PL through a contact hole CNT and the fifth drain electrode D5 is connected to the first source electrode S1 of the first TFT T1. The fifth channel C5, which is a channel area of the fifth active layer A5 overlapping the fifth gate electrode G5, is disposed between the fifth source electrode S5 and the fifth drain electrode D5. That is, the fifth active layer A5 connects the first active layer A1 and the common power line PL applying the first voltage ELVDD.

The fifth channel C5 of the fifth active layer A5 may be channel-doped with N-type impurities or P-type impurities, and the fifth source electrode S5 and the fifth drain electrode D5 are spaced apart from each other, having the fifth channel C5 therebetween, to be doped with doping impurities having an opposite type compared to that of the doping impurities doped to the fifth channel C5. The fifth active layer A5 is located on a substantially same plane as the first active layer A1, the second active layer A2, the third active layer A3 and the fourth active layer A4, includes a substantially same material as a material included in the first active layer A1, the second active layer A2, the third active layer A3 and the fourth active layer A4, and is formed integrally with the first active layer A1, the second active layer A2, the third active layer A3 and the fourth active layer A4.

The fifth gate electrode G5 is disposed above the fifth channel C5 of the fifth active layer A5 and is formed integrally with the light emission control line EM.

The sixth TFT T6 is located on the substrate 111 and includes a sixth active layer A6 and the sixth gate electrode G6.

The sixth active layer A6 includes the sixth source electrode S6, a sixth channel C6, and the sixth drain electrode D6. The sixth source electrode S6 is connected to the first drain electrode D1 of the first TFT T1, and the sixth drain electrode D6 is connected to the first electrode PE1 of the OLED through a contact hole CNT. The sixth channel C6, which is a channel area of the sixth active layer A6 overlapping the sixth gate electrode G6, is disposed between the sixth source electrode S6 and the sixth drain electrode D6. That is, the sixth active layer A6 connects the first active layer A1 and the first electrode PE1 of the OLED.

The sixth channel C6 of the sixth active layer A6 may be channel-doped with N-type impurities or P-type impurities, and the sixth source electrode S6 and the sixth drain electrode D6 are spaced apart from each other, having the sixth channel C6 therebetween, to be doped with doping impurities having an opposite type compared to that of the doping impurities doped to the sixth channel C6. The sixth active layer A6 is disposed on a substantially same plane as the first active layer A1, the second active layer A2, the third active layer A3, the fourth active layer A4 and the fifth active layer A5, includes a substantially same material as a material included in the first active layer A1, the second active layer A2, the third active layer A3, the fourth active layer A4 and the fifth active layer A5, and is formed integrally with the first active layer A1, the second active layer A2, the third active layer A3, the fourth active layer A4 and the fifth active layer A5.

The sixth gate electrode G6 is disposed above the sixth channel C6 of the sixth active layer A6 and is formed integrally with the light emission control line EM.

The seventh TFT T7 is disposed on the substrate 111 and includes a seventh active layer A7 and the seventh gate electrode G7.

The seventh active layer A7 includes the seventh source electrode S7, a seventh channel C7, and the seventh drain electrode D7. The seventh source electrode S7 is connected to the first electrode PE1 of the OLED of another pixel not illustrated in FIG. 4 (e.g., a pixel positioned upwardly of the pixel illustrated in FIG. 4), and the seventh drain electrode D7 is connected to the fourth source electrode S4 of the fourth TFT T4. The seventh channel C7, which is a channel area of the seventh active layer A7 overlapping the seventh gate electrode G7, is disposed between the seventh source electrode S7 and the seventh drain electrode D7. That is, the seventh active layer A7 connects the fourth active layer A4 and the first electrode PE1 of the OLED.

The seventh channel C7 of the seventh active layer A7 may be channel-doped with N-type impurities or P-type impurities, and the seventh source electrode S7 and the seventh drain electrode D7 are spaced apart from each other, having the seventh channel C7 therebetween, to be doped with doping impurities having an opposite type compared to that of the doping impurities doped to the seventh channel C7. The seventh active layer A7 is disposed on a substantially same plane as the first active layer A1, the second active layer A2, the third active layer A3, the fourth active layer A4, the fifth active layer A5 and the sixth active layer A6, includes a substantially same material as a material included in the first active layer A1, the second active layer A2, the third active layer A3, the fourth active layer A4, the fifth active layer A5 and the sixth active layer A6, and is formed integrally with the first active layer A1, the second active layer A2, the third active layer A3, the fourth active layer A4, the fifth active layer A5 and the sixth active layer A6.

The seventh gate electrode G7 is disposed above the seventh channel C7 of the seventh active layer A7 and is formed integrally with the third gate line SLn-2.

The first active layer A1 of the first TFT T1, the second active layer A2 of the second TFT T2, the third active layer A3 of the third TFT T3, the fourth active layer A4 of the TFT T4, the fifth active layer A5 of the fifth TFT T5, the sixth active layer A6 of the sixth TFT T6 and the seventh active layer A7 of the third transistor T7 are connected to one another.

A first insulating layer IL1, a second insulating layer IL2 and a third insulating layer IL3 are sequentially stacked on the first active layer A1, the second active layer A2, the third active layer A3, the fourth active layer A4, the fifth active layer A5, the sixth active layer A6 and the seventh active layer A7. Each of the first insulating layer IL1, the second insulating layer IL2 and the third insulating layer IL3 may be an organic insulating layer or an inorganic insulating layer including, for example, silicon nitride or silicon oxide. In addition, each of the insulating layers may be formed as a single layer or a multiple layer. The plurality of contact holes CNT are formed in the first insulating layer IL1, the second insulating layer IL2, and the third insulating layer IL3 in a selective manner. The first insulating layer IL1 contacts each of the first active layer A1, the second active layer A2, the third active layer A3, the fourth active layer A4, the fifth active layer A5, the sixth active layer A6 and the seventh active layer A7.

The first gate line SLn is disposed on the second active layer A2 and the third active layer A3 to extend in one direction across the second active layer A2 and the third active layer A3, and is formed integrally with the second gate electrode G2 and the third gate electrode G3 to be connected to the second gate electrode G2 and the third gate electrode G3.

The second gate line SLn-1, spaced apart from the first gate line SLn, is disposed on the fourth active layer A4, extends in the one direction across the fourth active layer A4, and is integrally formed with the fourth gate electrode G4 to be connected to the fourth gate electrode G4.

The third gate line SLn-2, spaced apart from the second gate line SLn-1, is disposed on the seventh active layer A7, extends in the one direction across the seventh active layer A7, and is integrally formed with the seventh gate electrode G7 to be connected to the seventh gate electrode G7.

The light emission control line EM, spaced apart from the first gate line SLn, is disposed on the fifth active layer A5 and the sixth active layer A6, extends in the one direction across the fifth gate electrode G5 and the sixth gate electrode G6, and is integrally formed with the fifth gate electrode G5 and the sixth gate electrode G6 to be connected to the fifth gate electrode G5 and the sixth gate electrode G6.

The light emission control line EM, the third gate line SLn-2, the second gate line SLn-1, the first gate line SLn, the first gate electrode G1, the second gate electrode G2, the third gate electrode G3, the fourth gate electrode G4, the fifth gate electrode G5, the sixth gate electrode G6 and the seventh gate electrode G7 are located on a substantially same layer, and include a substantially same material. However, exemplary embodiments are not limited thereto, and the light emission control line EM, the third gate line SLn-2, the second gate line SLn-1, the first gate line SLn, the first gate electrode G1, the second gate electrode G2, the third gate electrode G3, the fourth gate electrode G4, the fifth gate electrode G5, the sixth gate electrode G6 and the seventh gate electrode G7 may each be located on different layers, and include different materials from one another.

The capacitor Cst includes the first electrode CE1 and the second electrode CE2 which oppose each other, having an insulating layer therebetween. In such an exemplary embodiment, the second electrode CE2 may be the first gate electrode G1. The first electrode CE1 of the capacitor Cst is disposed on the first gate electrode G1 and is connected to the common power line PL through a contact hole.

The first electrode CE1 of the capacitor, along with the first gate electrode G1, defines the capacitor Cst, and the first gate electrode G1 and the first electrode CE1 of the capacitor may be disposed on different layers, and may include a substantially same metal or different metals.

The first electrode CE1 of the capacitor includes an opening area OA exposing a portion of the first gate electrode G1 and the gate bridge GB is connected to the first gate electrode G1 through the opening area OA.

The data line DL is located on the first gate line SLn to extend in a direction across the first gate line SLn, and is connected to the second source electrode S2 of the second active layer A2 through a contact hole CNT. The data line DL extends across the first gate line SLn, the second gate line SLn-1, the third gate line SLn-2, and the light emission control line EM.

The gate bridge GB, spaced apart from the common power line PL, is located on the first gate line SLn and is connected to each of the third drain electrode D3 of the third active layer A3 and the fourth drain electrode D4 of the fourth active layer A4 through the contact hole CNT. In addition, the gate bridge GB is connected to the first gate electrode G1.

The common power line PL, spaced apart from the data line DL, is located on the first gate line SLn and extends in a direction across the first gate line SLn. That is, the common power line PL extends across the first gate line SLn, the second gate line SLn-1, the third gate line SLn-2 and the light emission control line EM.

The common power line PL is connected to the OLED through at least one TFT. Referring to FIGS. 4 and 5, the common power line PL is connected to the first electrode CE1 of the capacitor Cst through a contact hole CNT and the fifth source electrode S5 of the fifth active layer A5 connected to the first active layer A1 through a contact hole CNT.

According to an exemplary embodiment, the common power line PL has a multilayer structure. Referring to FIG. 5, the common power line PL has a double-layer structure. However, exemplary embodiments are not limited to the above descriptions with respect to FIG. 5, and the common power line PL may have a single-layer structure or a structure including three or more layers.

According to an exemplary embodiment, the common power line PL includes a first power line PL1 and a second power line PL2 overlapping the first power line PL1. In addition, the pixel PX includes a first inorganic layer 221, a first organic layer 211 and a second inorganic layer 222 sequentially disposed between the second power line PL2 and the first power line PL1. That is, the second inorganic layer 222, the first organic layer 211 and the first inorganic layer 221 sequentially disposed between the first power line PL1 and the second power line PL2.

The first power line PL1 and the second power line PL2 constituting the common power line PL may include a metal. When such a metal is disposed on the first organic layer 211, the metal may be oxidized by the influence of oxygen or other elements remaining in the first organic layer 211. In the case where the metal is oxidized, accurate patterning may not be performed in an etching process, particularly in a dry etching process, and impurities may remain on the first organic layer 211 after patterning. Such impurities may cause defective products.

According to an exemplary embodiment, the first inorganic layer 221 and the second inorganic layer 222 are respectively located between the second power line PL2 and the first organic layer 211 and between the first power line PL1 and the first organic layer 211. Accordingly, the patterning failure may be substantially prevented in the process of forming the first power line PL1 and the second power line PL2 constituting the common power line PL.

The first power line PL1 and the second power line PL2 contact each other through a contact hole CNT1 in the pixel PX.

Since the common power line PL has a multilayer structure, current application and power supply through the common power line PL are secured. Accordingly, the voltage drop (IR drop) is substantially prevented, and the OLED display device 101 may have excellent luminous efficiency and high luminance. Particularly, the voltage drop (IR drop) is substantially prevented in the OLED display device 101 having a large size, and thus the display quality of the OLED display device 101 having a large size may be improved.

In addition, according to an exemplary embodiment, the reaction speed of the OLED may be improved, and a line width of the common power line PL may be reduced. Accordingly, the OLED display device 101 having high resolution may have a relatively high luminance.

The second organic layer 212 is disposed on the second power line PL2. The second organic layer 212 serves as an insulating layer and a planarization layer.

The data line DL, the first power line PL1 of the common power line PL and the gate bridge GB are located on a substantially same layer and include a substantially same material. In an alternative exemplary embodiment, each of the data line DL, the common power line PL, and the gate bridge GB may be formed on different layers in a selective manner and may include different materials from one another.

The initialization line RL is disposed on the second gate line SLn-2 to overlap the second gate line SLn-2 and is connected to the fourth source electrode S4 of the fourth active layer A4 through a contact hole. The initialization line RL may be formed on a substantially same layer as a layer on which the first electrode PE1 of the OLED is formed and includes a substantially same material as a material included in the first electrode PE1 of the OLED. In an alternative exemplary embodiment, the initialization line RL may be formed on a different layer from the layer on which the first electrode PE1 is disposed and may include different a material from the material included in the first electrode PE1.

The pixel defining layer 290 has an opening, and the first electrode PE1 of the OLED is exposed from the pixel defining layer 290 through the opening. The pixel defining layer 290 may define a light emission area of the OLED.

The OLED includes the first electrode PE1, the organic light emitting layer OL and the second electrode PE2. The first electrode PE1 is connected to the sixth drain electrode D6 of the sixth TFT T6 through a contact hole CNT. The organic light emitting layer OL is located between the first electrode PE1 and the second electrode PE2. The second electrode PE2 is disposed on the organic light emitting layer OL. One of the first electrode PE1 and the second electrode PE2 may have light transmittance. Light emitted from the organic light emitting layer OL may be directed toward one or more electrodes of the first electrode PE1 and the second electrode PE2.

Although not illustrated, a capping layer covering the OLED may be disposed on the OLED. In addition, a thin film encapsulation layer, or an encapsulation substrate, may be disposed on the OLED.

Hereinafter, the bending portion BD and the second area AREA2 of the substrate 111 will be described in more detail with reference to FIGS. 6, 7, 8, 9 and 10.

Figure 6:
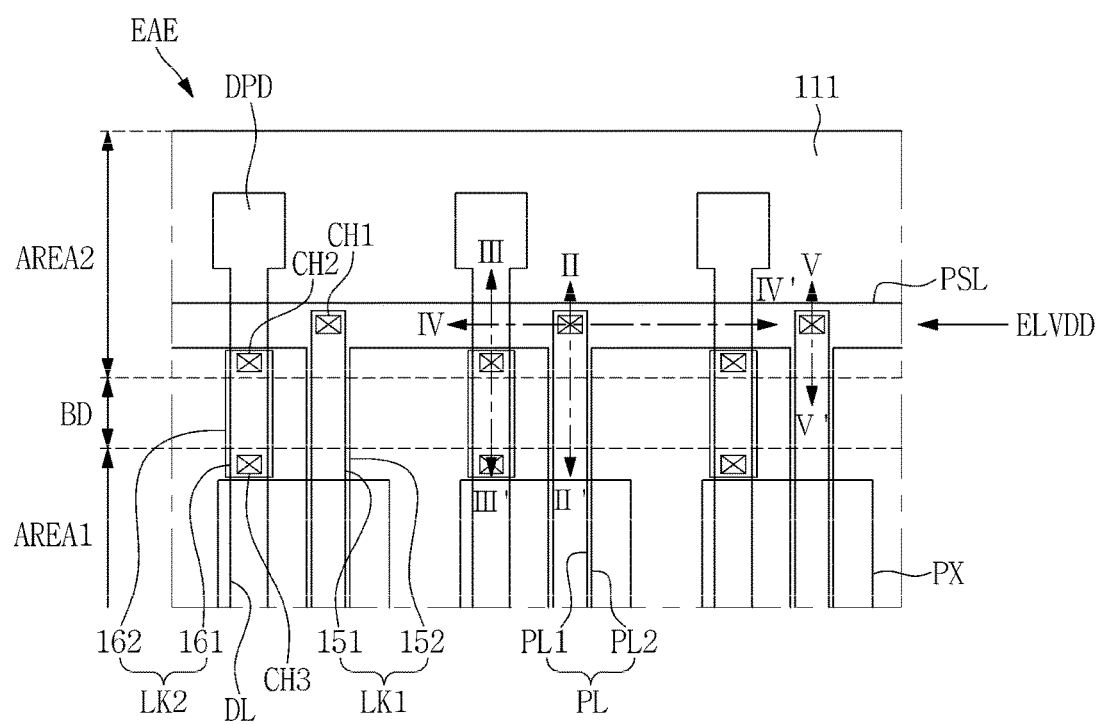
FIG. 6 is a plan view illustrating an area EAE of FIG. 1.

FIG. 6 is a plan view illustrating an area EAE of FIG. 1. FIG. 6 illustrates a portion of an edge of the first substrate 111.

The OLED display device 101 according to an exemplary embodiment includes link lines LK1 and LK2 that pass through the bending portion BD of the substrate 111. Each of the first link line LK1 and the second link line LK2 extends from the first area AREA1 to the second area AREA2 of the substrate 111.

In more detail, the first link line LK1 extends from the common power line PL and passes through the bending portion BD. The first link line LK1 passing through the bending portion BD is connected to a common power supply line PSL at the second area AREA2 and the common power supply line PSL is connected to a common power source (not illustrated). Accordingly, the common power line PL receives the first voltage ELVDD through the common power supply line PSL. However, exemplary embodiments are not limited thereto, the first voltage ELVDD may be directly applied to the first link line LK1.

A terminal may be disposed at one end portion of the common power supply line PSL (not illustrated). The common power supply line PSL may be connected to the common power source (not illustrated) through the terminal.

The second link line LK2 is connected to the data line DL and passes through the bending portion BD.

The second link line LK2 passing through the bending portion BD is connected to a terminal DPD at the second area AREA2 and receives the data signal through the terminal DPD. The terminal DPD illustrated in FIG. 6 is a data terminal having a pad shape. However, exemplary embodiments are not limited thereto, and the terminal DPD may have a substantially same width as a width of the second link line LK2.

At least one of the first link line LK1 and the second link line LK2 includes first conductive lines 151 and 161 and second conductive lines 152 and 162, respectively overlapping one another with an insulating layer interposed therebetween. The insulating layer includes the second inorganic layer 222 on the first conductive lines 151 and 161, the first organic layer 211 on the second inorganic layer 222 and the first inorganic layer 221 selectively disposed on the first organic layer 211. In such an exemplary embodiment, the first inorganic layer 221 is disposed in an area other than the bending portion BD. In addition, the second inorganic layer 222 may be omitted.

Hereinafter, the structures of the first link line LK1 and the second link line LK2 will be described in detail with reference to FIGS. 7, 8, 9 and 10

Figure 7:
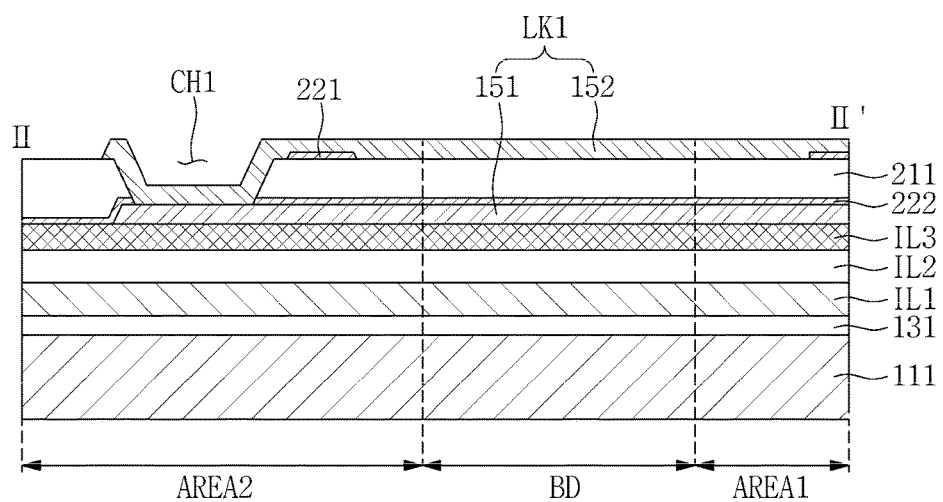
FIG. 7 is a cross-sectional view taken along line II-II' of FIG. 6.
Figure 8:
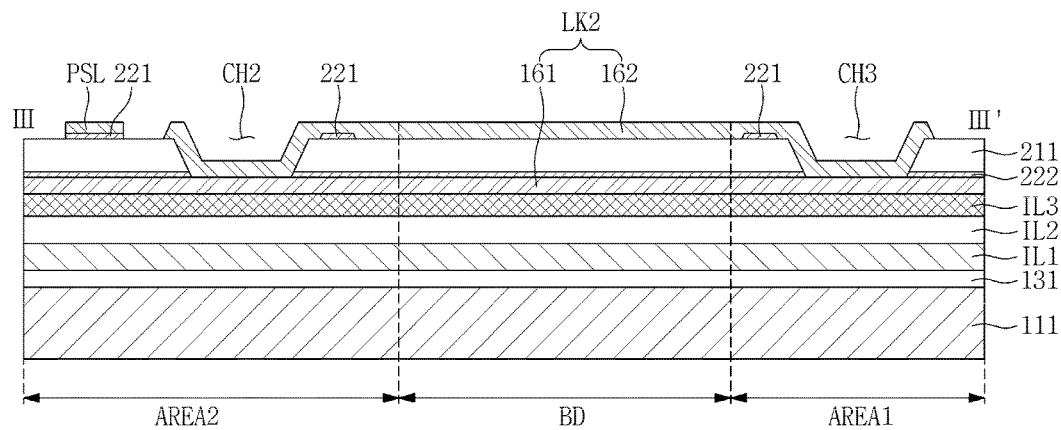
FIG. 8 is a cross-sectional view taken along line III-III' of FIG. 6.

FIG. 7 is a cross-sectional view taken along line II-II' of FIG. 6. FIG. 7 shows a cross section of the first link line LK1. FIG. 8 is a cross-sectional view taken along line III-III' of FIG. 6. FIG. 8 shows a cross section of the second link line LK2.

Referring to FIGS. 7 and 8, the OLED display device 101 according to an exemplary embodiment includes the first conductive lines 151 and 161 disposed on the bending portion BD of the substrate 111 and extending from the first area AREA1 to the second area AREA2, the second inorganic layer 222 disposed on the first conductive lines 151 and 161, the first organic layer 211 disposed on the second inorganic layer 222, the first inorganic layer 221 disposed on the first organic layer 211 and the second conductive lines 152 and 162, disposed on the first organic layer 211, overlapping the first conductive lines 151 and 161 and extending from the first area AREA1 to the second area AREA2. The first conductive lines 151 and 161 and the second conductive lines 152 and 162 respectively contact each other in the first area AREA1 and/or the second area AREA2.

In addition, the first inorganic layer 221 is disposed in an area other than the bending portion BD between the first organic layer 211 and the second conductive lines 152 and 162. The first inorganic layer 221 is not disposed at the bending portion BD.

The first conductive lines 151 and 161 and the second conductive lines 152 and 162 may include a metal. In the case where such a metal contacts the first organic layer 211, the metal may be oxidized by oxygen or other elements remaining in the first organic layer 211 may form a compound which may not be easily removed with the metal. In the case where the metal is oxidized, a patterning failure may occur and the patterning residue may remain on the first organic layer 211.

In order to prevent such an issue, the first inorganic layer 211 and the second inorganic layer 222 are respectively disposed between the second conductive lines 152 and 162 and the first organic layer 211 and between the first conductive lines 151 and 161 and the first organic layer 211. However, when the substrate 111 is bent, crack may occur in the inorganic layers 221 and 222. In order to prevent defects due to the cracks of the inorganic layers 221 and 222, in an exemplary embodiment, the first inorganic layer 221 is not disposed at the bending portion BD.

Referring to FIGS. 6 and 7, the first conductive line 151 and the second conductive line 152 constituting the first link line LK1 contact each other through the first contact hole CH1 defined in the second area AREA2. In such an exemplary embodiment, the first link line LK1 is a common power link line.

Referring to FIGS. 6 and 8, the first conductive line 161 and the second conductive line 162 constituting the second link line LK2 contact each other through a second contact hole CH2 disposed in the second area AREA2 and in a third contact hole CH3 disposed in the first area AREA1. In such an exemplary embodiment, the second link line LK2 is a data link line.

As such, the pairs of the first conductive lines 151 and 161 and the second conductive lines 152 and 162 respectively overlapping each other constitute the link lines LK1 and LK2.

Since each of the first link line LK1 and the second link line LK2 includes both of the first conductive lines 151 and 161 and the second conductive lines 152 and 162 in a corresponding manner, although one of the first conductive lines 151 and 161 and the second conductive lines 152 and 162 is disconnected in the bending portion BD, a power or a signal may be transmitted through a remaining first link line LK1 which is not disconnected and a remaining second link line LK2 which is not disconnected. Accordingly, defects of the OLED display device 101 may be reduced.

Figure 9:
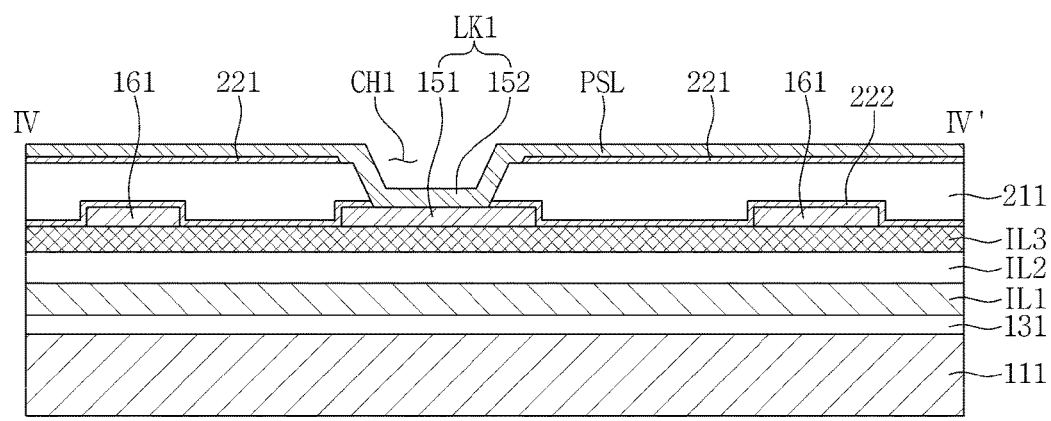
FIG. 9 is a cross-sectional view taken along line IV-IV' of FIG. 6.

FIG. 9 is a cross-sectional view taken along line IV-IV' of FIG. 6. A cross section of the common power supply line PSL is shown in FIG. 9.

Referring to FIG. 9, the common power supply line PSL contacts the first link line LK1 through the first contact hole CH1 and applies the first voltage ELVDD to the first link line LK1. The common power supply line PSL includes a substantially same material as a material included in the second conductive line 152 and is formed through a substantially same process as a process through which the second conductive line 152 is formed.

The first conductive line 151 and the second conductive line 152 are connected to the pixel PX.

Figure 10:
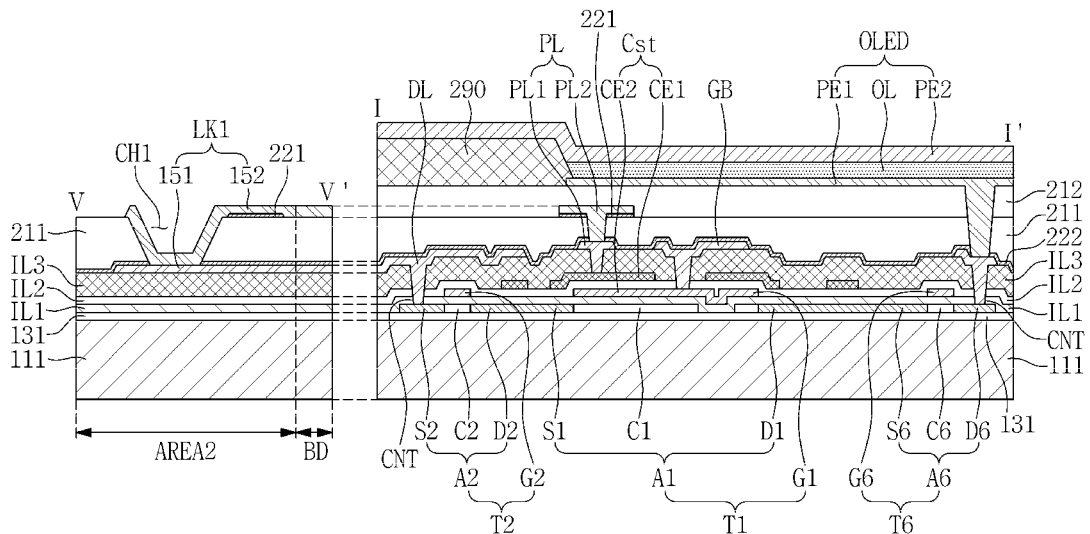
FIG. 10 is a view comparing a cross-sectional view taken along line V-V' of FIG. 6 and the cross-sectional view taken along line I-I' of FIG. 4.

FIG. 10 is a view comparing a cross-sectional view taken along line V-V' of FIG. 6 and the cross-sectional view taken along line I-I' of FIG. 4.

According to an exemplary embodiment, the pixel PX includes the common power line PL and the first link line LK1, which is a common power link line, is connected to the common power line PL. Accordingly, the first conductive line 151 and the second conductive line 152 are connected to the common power line PL.

Referring to FIG. 10, the first power line PL1 of the common power line PL is disposed on a substantially same plane as the first conductive line 151, and the second power line PL2 is disposed on a substantially same plane as the second conductive line 152.

The first power line PL1 and the first conductive line 151 may include a substantially same material. The first power line PL1 and the first conductive line 151 may be integrally formed.

In addition, the second power line PL2 and the second conductive line 152 may include a substantially same material. The second power line PL2 and the second conductive line 152 may be integrally formed.

Hereinafter, a display device according to an alternative exemplary embodiment will be described with reference to FIGS. 11, 12, 13, 14, 15 and 16. The display device according to an alternative exemplary embodiment is an OLED display device 102.

Figure 11:
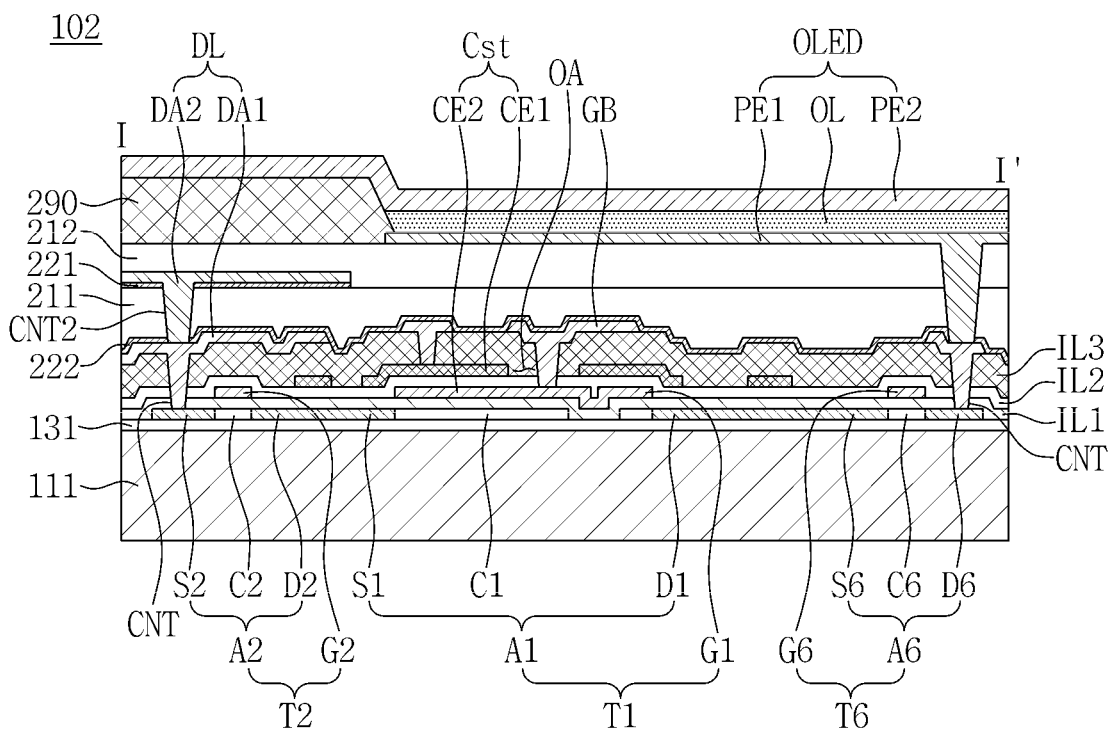
FIG. 11 is a cross-sectional view illustrating an OLED display device according to an alternative exemplary embodiment.

FIG. 11 is a cross-sectional view illustrating the OLED display device 102 according to an alternative exemplary embodiment. According to an alternative exemplary embodiment, a data line DL may have a multilayer structure. However, an alternative exemplary embodiment is not limited to FIG. 11.

Referring to FIG. 11, the data line DL includes a lower line DA1 and an upper line DA2 overlapping the lower line DA1. In addition, a pixel PX includes a first inorganic layer 221, a first organic layer 211 and a second inorganic layer 222 sequentially disposed between the upper line DA2 and the lower line DA1. The lower line DA1 and the upper line DA2 contact each other through a contact hole CNT2 in the pixel PX. As used herein, the upper line DA2 and the lower line DA1 are merely names for distinguishing the two lines DA1 and DA2, and the terms "upper" and "lower" do not limit the positions of the upper line DA1 and the lower line DA2. In addition, the second inorganic layer 222 may be omitted.

As described above, since the data line DL has a multilayer structure, signal application through the data line DL is secured. Accordingly, the OLED display 102 may have excellent luminous efficiency and the reaction speed of the OLED may be improved.

Figure 12:
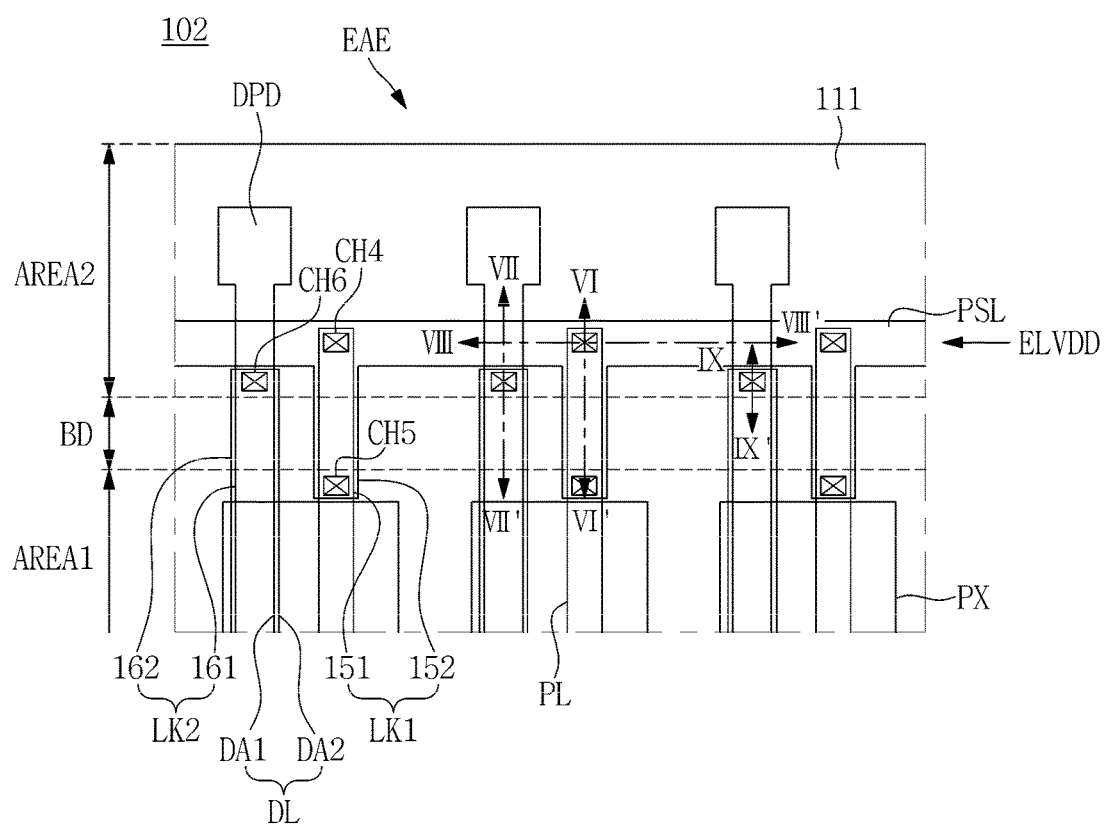
FIG. 12 is a plan view illustrating a portion of an OLED display device according to an alternative exemplary embodiment.
Figure 13:
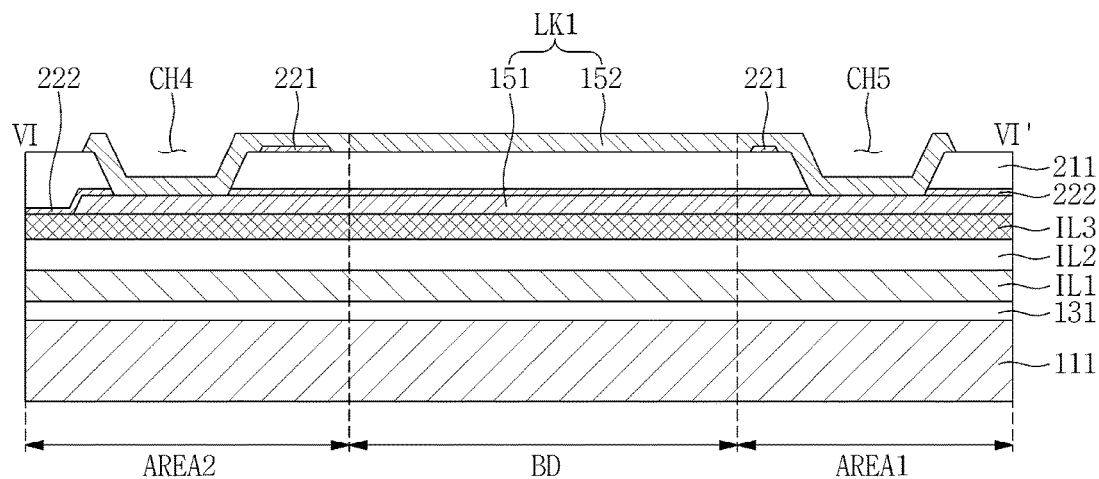
FIG. 13 is a cross-sectional view taken along line VI-VI' of FIG. 12.
Figure 14:
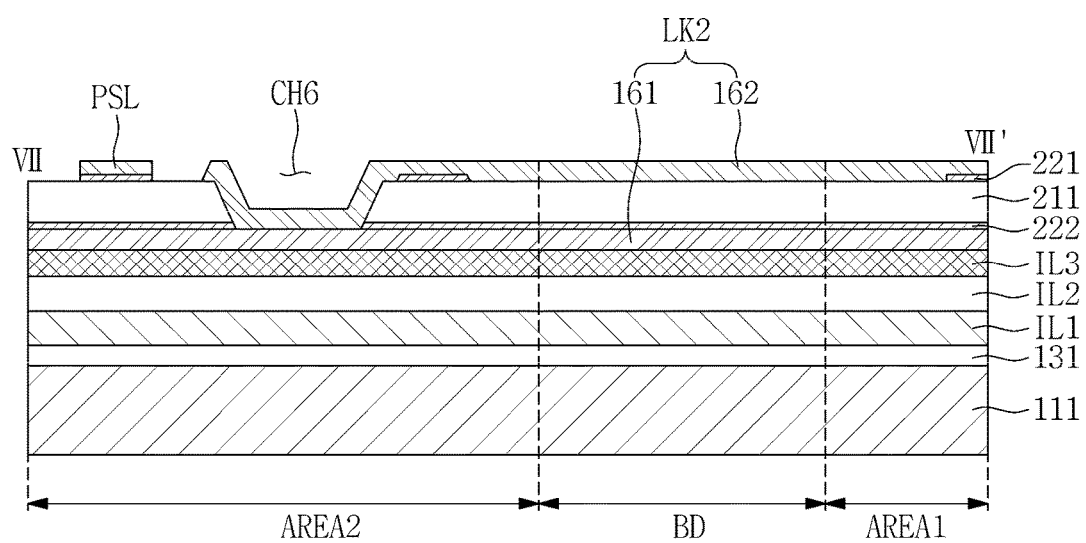
FIG. 14 is a cross-sectional view taken along line VII-VII' of FIG. 12.
Figure 15:
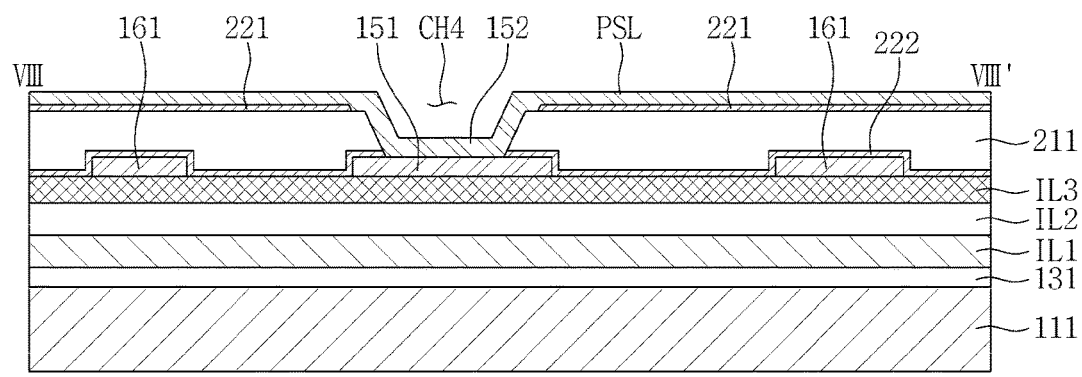
FIG. 15 is a cross-sectional view taken along line VIII-VIII' of FIG. 12.
Figure 16:
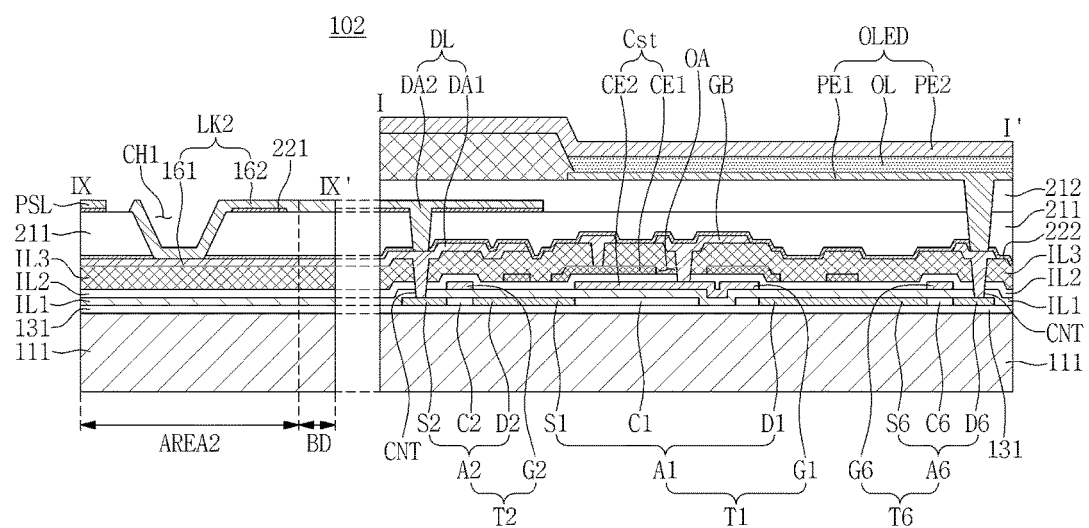
FIG. 16 is a view comparing a cross-sectional view taken along line IX-IX' of FIG. 12 and the cross-sectional view of FIG. 11.

FIG. 12 is a plan view illustrating a portion of the OLED display device according to an alternative exemplary embodiment, FIG. 13 is a cross-sectional view taken along line VI-VI' of FIG. 12, FIG. 14 is a cross-sectional view taken along line VII-VII' of FIG. 12, FIG. 15 is a cross-sectional view taken along line VIII-VIII' of FIG. 12, and FIG. 16 is a view comparing a cross-sectional view taken along line IX-IX' of FIG. 12 and the cross-sectional view of FIG. 11.

The pixel PX is connected to the data line DL in a first area AREA1 and a second link line LK2 is connected to the data line DL. A first conductive line 161 and a second conductive line 162 constituting the second link line LK2 are connected to the data line DL.

According to an alternative exemplary embodiment, the lower line DA1 of the data line DL is disposed on a substantially same layer as a layer on which the first conductive line 161 is disposed, and the upper line DA2 is disposed on a substantially same layer as a layer on which the second conductive line 162 is disposed.

The lower line DA1 and the first conductive line 161 may include a substantially same material. In addition, the lower line DA1 and the first conductive line 161 may be integrally formed. The upper line DA2 and the second conductive line 162 may include a substantially same material. In addition, the upper line DA2 and the second conductive line 162 may be integrally formed.

Referring to FIG. 13, a first conductive line 151 and a second conductive line 152 constituting a first link line LK1 contact each other through a fourth contact hole CH4 defined in a second area AREA2 and a fifth contact hole CH5 defined in the first area AREA1.

Referring to FIG. 14, the first conductive line 161 and the second conductive line 162 constituting the second link line LK2 contact each other through a sixth contact hole CH6 defined in the second area AREA2.

Referring to FIG. 15, a common power supply line PSL contacts the first conductive line 151 through the fourth contact hole CH4 to apply a first voltage ELVDD to the first link line LK1.

Hereinafter, a method of manufacturing the OLED display device 101 according to an exemplary embodiment will be described with reference to FIGS. 17A, 17B, 17C, 17D, 17E, 17F and 17G.

FIGS. 17A, 17B, 17C, 17D, 17E, 17F and 17G are views illustrating a manufacturing process with respect to the cross-sectional view taken along line II-II' of FIG. 6.

Figure 17A:
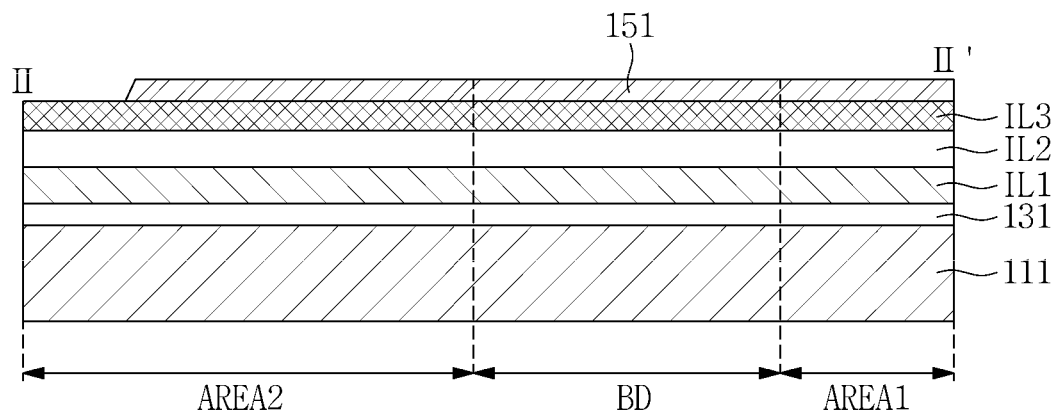
FIGS. 17A, 17B, 17C, 17D, 17E, 17F and 17G are views illustrating a manufacturing process with respect to the cross-sectional view taken along line II-II' of FIG. 6.

First, referring to FIG. 17A, the first conductive line 151 is formed on the substrate 111. For example, the first conductive line 151 is formed on the third insulating layer IL3. The first conductive line 151 includes a metal. The first conductive line 151 may include, for example, at least one selected from the group consisting of: silver (Ag), copper (Cu), aluminum (Al), titanium (Ti), tantalum (Ta), magnesium (Mg), tin (Sn), indium (In) and zinc (Zn).

In the case where the substrate 111 includes the bending portion BD, the first conductive line 151 passes through the bending portion BD of the substrate 111.

Figure 17B:
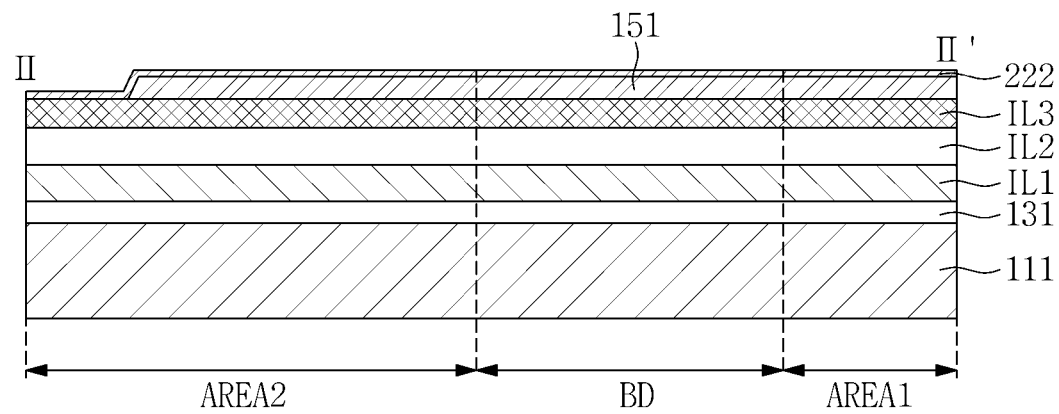

Referring to FIG. 17B, the second inorganic layer 221 is formed on the first conductive line 151. The second inorganic layer 221 may include silicon (Si). For example, the second inorganic layer 221 may include at least one of silicon oxide (SiOx) and silicon nitride (SiNx).

The second inorganic layer 221 is formed on an entire upper surface of the substrate 111 including the first conductive line 151.

Since the second inorganic layer 221 is disposed on the first conductive line 151, the first conductive line 151 is prevented from contacting the first organic layer 211 in a subsequent organic layer process. Accordingly, the first conductive line 151 is substantially prevented from being oxidized or contaminated by oxygen or other elements remaining in the first organic layer 211. The process of forming the second inorganic layer 221 may be omitted.

Figure 17C:
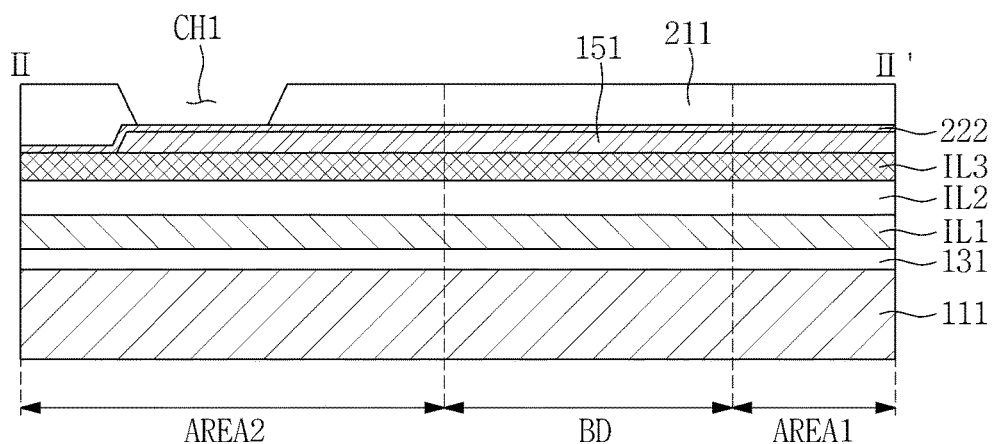

Referring to FIG. 17C, the first organic layer 211 is formed on the second inorganic layer 221. The first organic layer 211 has the first contact hole CH1. The first organic layer 211 may include a polymerizable organic material.

Figure 17D:
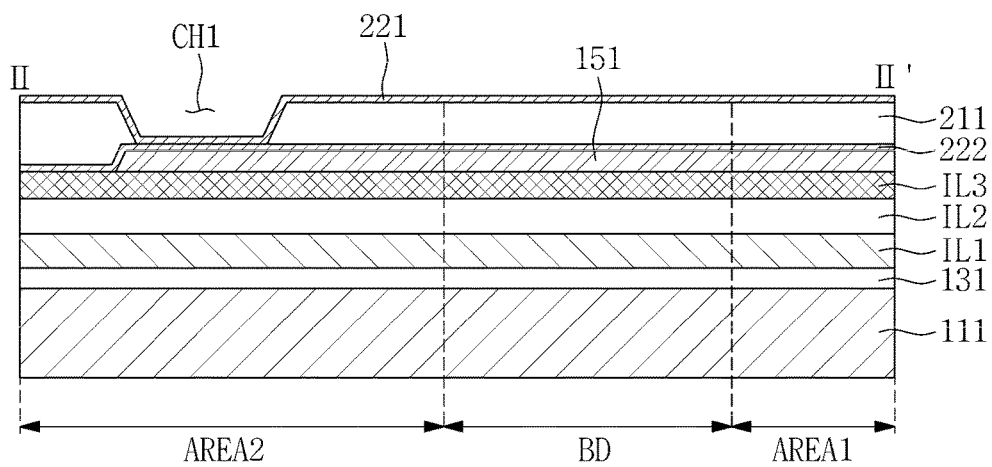

Referring to FIG. 17D, the first inorganic layer 222 is formed on the first organic layer 211. The first inorganic layer 222 is disposed on an entire surface of the first organic layer 211 having the first contact hole CH1. The first inorganic layer 222 may include a substantially same material as or a different material from a material included in the second inorganic layer 221.

Figure 17E:
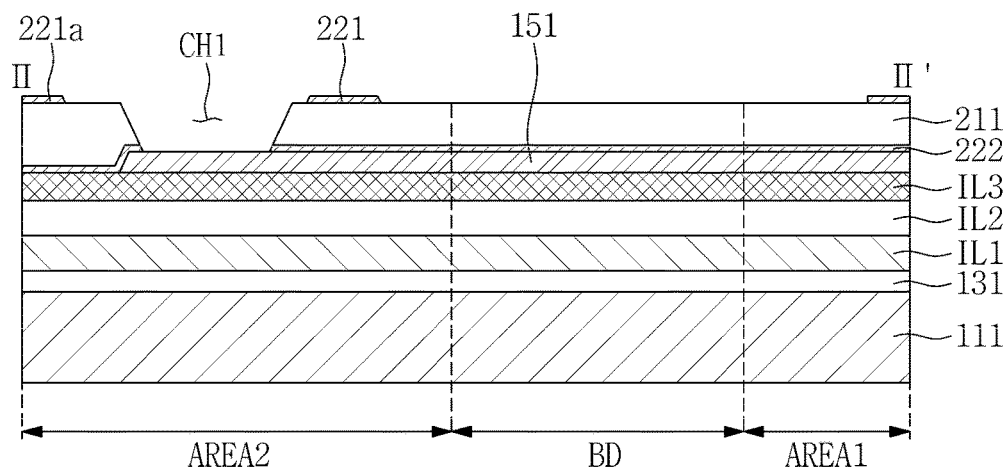

Referring to FIG. 17E, the first inorganic layer 222 is selectively removed, and the first organic layer 222 is selectively exposed. In such an exemplary embodiment, the first inorganic layer 222 formed on the bending portion BD is removed.

In addition, in an area other than the bending portion BD, the first inorganic layer 222 disposed in an area except the position at which the second conductive line 152 is to be formed may be removed.

When the substrate 111 is bent, a crack may be generated in the first inorganic layer 222. Defects may occur due to cracks in the first inorganic layer 222. In order to prevent such a crack, the first inorganic layer 222 formed on the bending portion BD is removed so that the first inorganic layer 222 is not disposed on the bending portion BD.

In addition, in the process of selectively removing the first inorganic layer 222, the first inorganic layer 222 and the second inorganic layer 221 in the contact hole CH1 are removed.

As described above, as the first inorganic layer 222 is selectively removed, gases (also referred to as "outgas") generated in the first organic layer 211 during the manufacturing process may be easily discharged to the outside.

In addition, the first inorganic layer 222 and the second inorganic layer 221 may be substantially simultaneously removed by a single process. Compared with the method in which the first inorganic layer 222 and the second inorganic layer 221 are separately removed, in an exemplary embodiment, the number of processes requiring patterning may be reduced, such that the manufacturing efficiency may be improved.

Figure 17F:
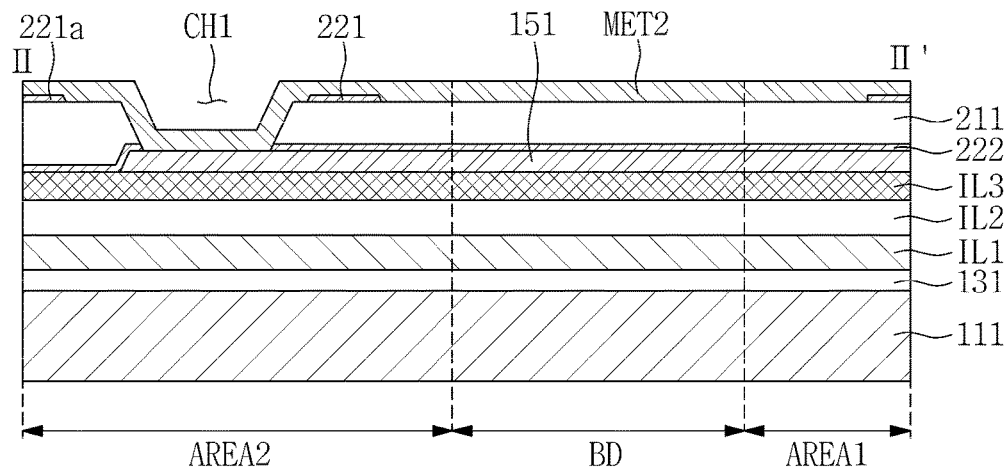

Referring to FIG. 17F, a conductive film MET2 for forming the second conductive line 152 is formed on the first inorganic layer 222 and the exposed first organic layer 211. According to an exemplary embodiment, the conductive film MET2 for forming the second conductive line 152 is a metal film including a metal. The conductive film MET2 for forming the second conductive line 152 may include a substantially same material as or a different material from a material included in the first conductive line 151.

When the conductive film MET2 for forming the second conductive line 152 which includes metal contacts the first organic layer 211, the metal may be contaminated or oxidized by oxygen or other elements remaining in the first organic layer 211. In the case where the metal is oxidized or contaminated, a patterning defect may occur in a subsequent process of forming the second conductive line 152, and the patterning residue may remain on the first organic layer 211.

In order to substantially prevent such an issue, the first inorganic layer 222 is disposed between the first organic layer 211 and the second conductive line 152. In addition, when the substrate 111 is bent, the first inorganic layer 222 is not disposed at the bending portion BD in order to prevent a crack from being generated in the first inorganic layer 222.

Figure 17G:
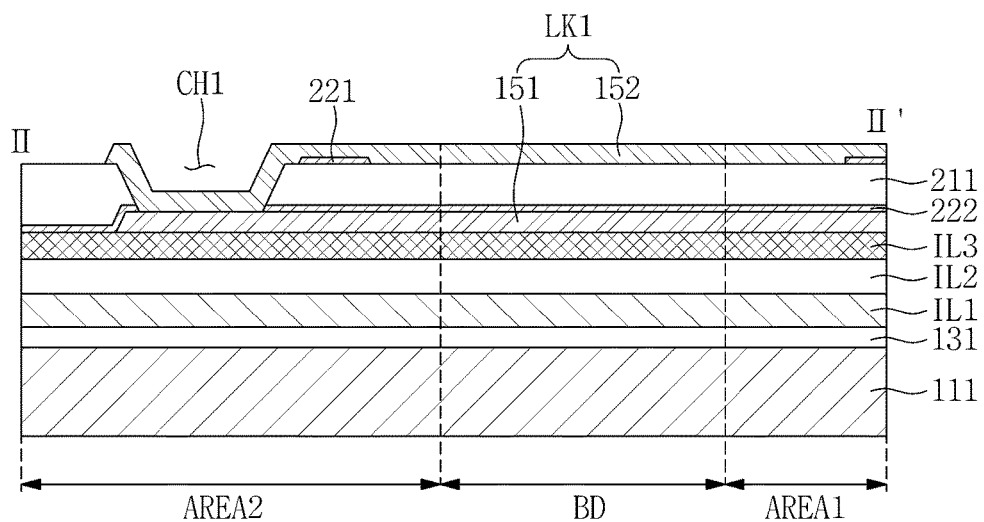

Next, referring to FIG. 17G, the conductive film MET2 for forming the second conductive line 152 is patterned to form the second conductive line 152.

Any known patterning method may be applied to form the second conductive line 152. For example, the second conductive line 152 may be formed by dry etching.

The second conductive line 152 passes through the bending portion BD of the substrate 111. In addition, the first conductive line 151 and the second conductive line 152 contact each other through the contact hole CH1. A pair of the first conductive line 151 and the second conductive line 152 which are in contact with each other through the contact hole CH1 constitute one link line, that is, the first link line LK1.

Although the OLED display devices have been exemplarily described in the above embodiments, the technical idea of the present inventive concept may be applied to other display devices. For example, the present inventive concept may be applied to a liquid crystal display ("LCD") display, an electrophoretic display, and the like.

As set forth hereinabove, according to one or more exemplary embodiments, the display device includes a double wiring and has a relatively high luminance. Further, according to one or more exemplary embodiments, since the substrate is bent so that the terminal is disposed on a rear surface of the display area, the display device may include a narrow bezel and the occurrence of cracks in the bending portion may be substantially prevented.

While the present inventive concept has been illustrated and described with reference to the exemplary embodiments thereof, it will be apparent to those of ordinary skill in the art that various changes in form and detail may be made thereto without departing from the spirit and scope of the present inventive concept.

What is claimed is:

1. A display device comprising:
    a substrate comprising a first area, a second area, and a bending portion disposed between the first area and the second area;
    a pixel disposed on the first area of the substrate;
    a terminal disposed on the second area of the substrate;
    a first conductive line disposed on the bending portion of the substrate and extending from the first area to the second area;
    a first organic layer disposed on the first conductive line;
    a first inorganic layer disposed on the first organic layer in an area other than the bending portion; and
    a second conductive line disposed on the first organic layer and the first inorganic layer and overlapping the first conductive line to extend from the first area to the second area,
    wherein the first conductive line and the second conductive line contact each other in at least one of the first area and the second area.

2. The display device as claimed in claim 1, further comprising a second inorganic layer disposed between the first conductive line and the first organic layer.

3. The display device as claimed in claim 1, wherein the first conductive line and the second conductive line constitute one link line.

4. The display device as claimed in claim 1, wherein the first conductive line and the second conductive line are connected to the pixel.

5. The display device as claimed in claim 1, wherein the pixel comprises a common power line, and
    the first conductive line and the second conductive line are connected to the common power line.

6. The display device as claimed in claim 5, wherein the common power line comprises a first power line and a second power line,
    the first power line is disposed on a substantially same plane as the first conductive line, and
    the second power line is disposed on a substantially same plane as the second conductive line.

7. The display device as claimed in claim 6, wherein the first power line and the first conductive line comprise a substantially same material.

8. The display device as claimed in claim 6, wherein the first power line and the first conductive line are integrally formed.

9. The display device as claimed in claim 6, wherein the second power line and the second conductive line comprise a substantially same material.

10. The display device as claimed in claim 6, wherein the second power line and the second conductive line are integrally formed.

11. The display device as claimed in claim 6, wherein the pixel comprises the second inorganic layer, the first organic layer and the first inorganic layer sequentially disposed between the first power line and the second power line.

12. The display device as claimed in claim 6, wherein the first power line and the second power line contact each other in the pixel.

13. The display device as claimed in claim 5, wherein the pixel comprises an organic light emitting element, and
the common power line is connected to the organic light emitting element through at least one thin film transistor.

14. The display device as claimed in claim 1, wherein the pixel is connected to a data line at the first area, and
the first conductive line and the second conductive line are connected to the data line.

15. The display device as claimed in claim 14, wherein the data line comprises a lower line and an upper line overlapping the lower line,
the lower line is disposed on a substantially same plane as the first conductive line, and
the upper line is disposed on a substantially same layer as the second conductive line.

16. The display device as claimed in claim 15, wherein the lower line and the first conductive line comprise a substantially same material.

17. The display device as claimed in claim 15, wherein the lower line and the first conductive line are integrally formed.

18. The display device as claimed in claim 15, wherein the upper line and the second conductive line comprise a substantially same material.

19. The display device as claimed in claim 15, wherein the upper line and the second conductive line are integrally formed.

20. The display device as claimed in claim 15, wherein the pixel comprises the second inorganic layer, the first organic layer and the first inorganic layer sequentially disposed between the lower line and the upper line.

21. The display device as claimed in claim 15, wherein the lower line and the upper line contact each other in the pixel.

22. The display device as claimed in claim 1, wherein the substrate is bent at the bending portion, and an inner radius of curvature of the bending portion is in a range of about 0 μm to about 500 μm.

23. A method of manufacturing a display device, the method comprising
forming a first conductive line on a substrate comprising a bending portion, the first conductive line passing through the bending portion;
forming a first organic layer on the first conductive line;
forming a first inorganic layer on the first organic layer;
removing the first inorganic layer in a selective manner to expose the first organic layer in a selective manner; and
forming a second conductive line on the first inorganic layer and the selectively exposed first organic layer,
wherein removing the first inorganic layer in a selective manner comprises removing the first inorganic layer disposed on the bending portion.

24. The method as claimed in claim 23, further comprising forming a second inorganic layer on the first conductive line after forming the first conductive line and before forming the first organic layer.

25. The method as claimed in claim 24, wherein the first organic layer has a contact hole, and
removing the first inorganic layer in a selective manner comprises removing the second inorganic layer and the first inorganic layer at the contact hole.

26. The method as claimed in claim 25, wherein the first conductive line and the second conductive line contact each other at the contact hole.

27. A display device comprising:
a substrate comprising a bending portion;
a gate line extending along a first direction on the substrate;
a data line extending along a second direction on the substrate, the data line intersecting the gate line; and
a common power line extending along the second direction on the substrate, the common power line spaced apart from the data line and intersecting the gate line;
a first link line connected to the common power line, extending from the common power line and passing through the bending portion; and
a second link line connected to the data line, extending from the data line and passing through the bending portion,
wherein at least one of the first link line and the second link line comprises a first conductive line and a second conductive line overlapping each other with an insulating layer interposed therebetween,
the insulating layer comprises:
a first organic layer disposed on the first conductive line; and
a first inorganic layer disposed on the first organic layer in a selective manner, and
wherein the first inorganic layer is disposed on an area other than the bending portion.

28. The display device as claimed in claim 27, wherein the insulating layer further comprises a second inorganic layer disposed between the first conductive line and the first organic layer.

* * * * *